US012566386B2

(12) United States Patent
Mizuta

(10) Patent No.: US 12,566,386 B2
(45) Date of Patent: Mar. 3, 2026

(54) EXPOSURE APPARATUS, EXPOSURE METHOD, AND METHOD FOR MANUFACTURING SEMICONDUCTOR DEVICE

(71) Applicant: Kioxia Corporation, Tokyo (JP)

(72) Inventor: Yoshio Mizuta, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 120 days.

(21) Appl. No.: 18/664,308

(22) Filed: May 15, 2024

(65) Prior Publication Data

US 2024/0419085 A1     Dec. 19, 2024

(30) Foreign Application Priority Data

Jun. 15, 2023    (JP) ................................. 2023-098698

(51) Int. Cl.
*G03F 7/00*          (2006.01)

(52) U.S. Cl.
CPC ...... *G03F 7/70516* (2013.01); *G03F 7/70258* (2013.01); *G03F 7/70508* (2013.01)

(58) Field of Classification Search
CPC ............. G03F 7/70258; G03F 7/70508; G03F 7/70516; G03F 7/70633; G03F 7/706845; G03F 7/706837; G03F 9/7003; G03F 9/7046; H01L 21/68; H01L 21/70; H01L 23/544
See application file for complete search history.

(56) References Cited

U.S. PATENT DOCUMENTS

| | | |
|---|---|---|
| 11,164,843 B2 | 11/2021 | Tamura et al. |
| 11,267,237 B2 | 3/2022 | Terai et al. |
| 11,417,543 B2 | 8/2022 | Otsuka et al. |
| 11,710,649 B2 | 7/2023 | Mizuta |
| 11,776,931 B2 | 10/2023 | Kawadahara |
| 11,791,223 B2 | 10/2023 | Sugaya et al. |
| 11,935,775 B2 | 3/2024 | Nagai et al. |

(Continued)

FOREIGN PATENT DOCUMENTS

| | | |
|---|---|---|
| EP | 4134746 A1 | 2/2023 |
| JP | 2007158200 A | 6/2007 |

(Continued)

OTHER PUBLICATIONS

"U.S. Appl. No. 18/461,096, First Named Inventor: Yoshio Mizuta; Title: "Exposure Apparatus, Exposure Method, and Method for Manufacturing Semiconductor Device"; Filed: Sep. 5, 2023".

*Primary Examiner* — Peter B Kim
(74) *Attorney, Agent, or Firm* — Holtz, Holtz & Volek PC

(57) ABSTRACT

An exposure apparatus according to one embodiment includes a stage and a control device. In an exposure process, the control device is configured to: calculate a calculated value of a magnification component by performing function approximation on measurement results of three or more alignment marks arranged on the substrate; set a first lower limit value and/or a first upper limit value for an alignment correction value of a magnification component; in a case where the first lower limit value is set and the calculated value is less than the first lower limit value, set the alignment correction value of the magnification component to a second correction value that is larger than the calculated value and smaller than the first correction value.

17 Claims, 19 Drawing Sheets

(56) References Cited

U.S. PATENT DOCUMENTS

| | | |
|---|---|---|
| 2002/0053644 A1 | 5/2002 | Yonekawa |
| 2004/0059540 A1* | 3/2004 | Matsumoto .......... G03F 9/7092 |
| | | 702/150 |
| 2021/0263427 A1 | 8/2021 | Li et al. |
| 2023/0091517 A1 | 3/2023 | Mizuta |
| 2023/0195002 A1 | 6/2023 | Mizuta |
| 2023/0236495 A1 | 7/2023 | Mizuta |
| 2023/0411197 A1 | 12/2023 | Mizuta |

FOREIGN PATENT DOCUMENTS

| | | | |
|---|---|---|---|
| JP | 2020013813 A | 1/2020 |
| JP | 2021040094 A | 3/2021 |
| JP | 2021044442 A | 3/2021 |
| JP | 2021044520 A | 3/2021 |
| JP | 2021114626 A | 8/2021 |
| JP | 2021150393 A | 9/2021 |
| JP | 2021150533 A | 9/2021 |
| JP | 2023008587 A | 1/2023 |
| JP | 2023089658 A | 6/2023 |

* cited by examiner

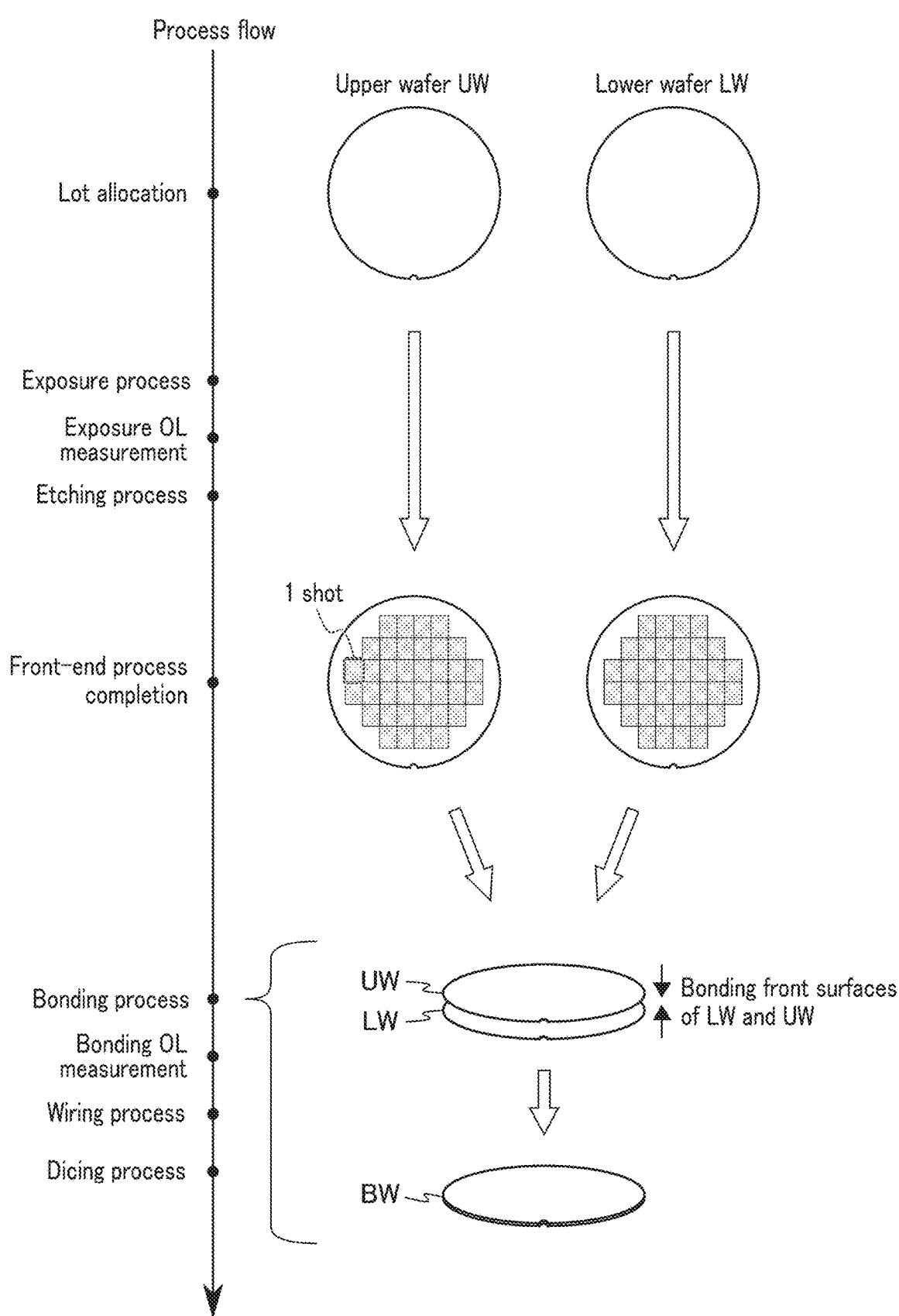
F I G. 1

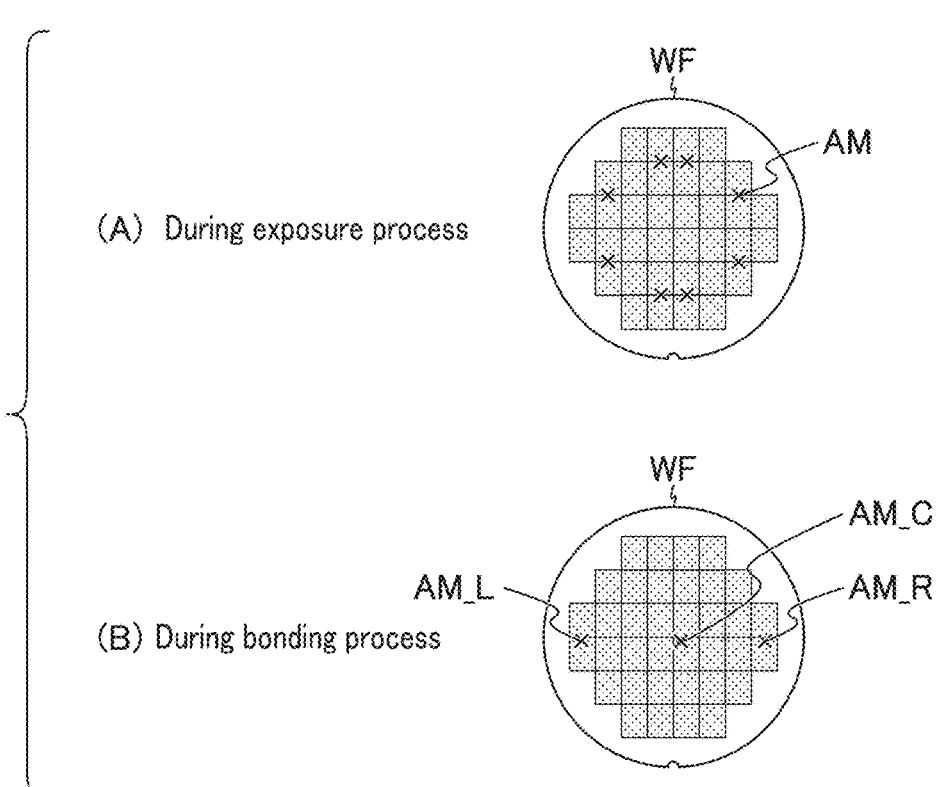

(A) During exposure process (B) During bonding process

FIG. 2

| Overlay deviation component | Exposure apparatus | Bonding apparatus |
|---|---|---|
| Shift component | Correctable | Correctable |
| XY common magnification component | Correctable | Correctable |
| XY differential magnification component | Correctable | Difficult to correct |
| Rotation component | Correctable | Correctable |
| Orthogonality component | Correctable | Difficult to correct |
| Random component | Correctable in units of shots | Difficult to correct |

FIG. 3

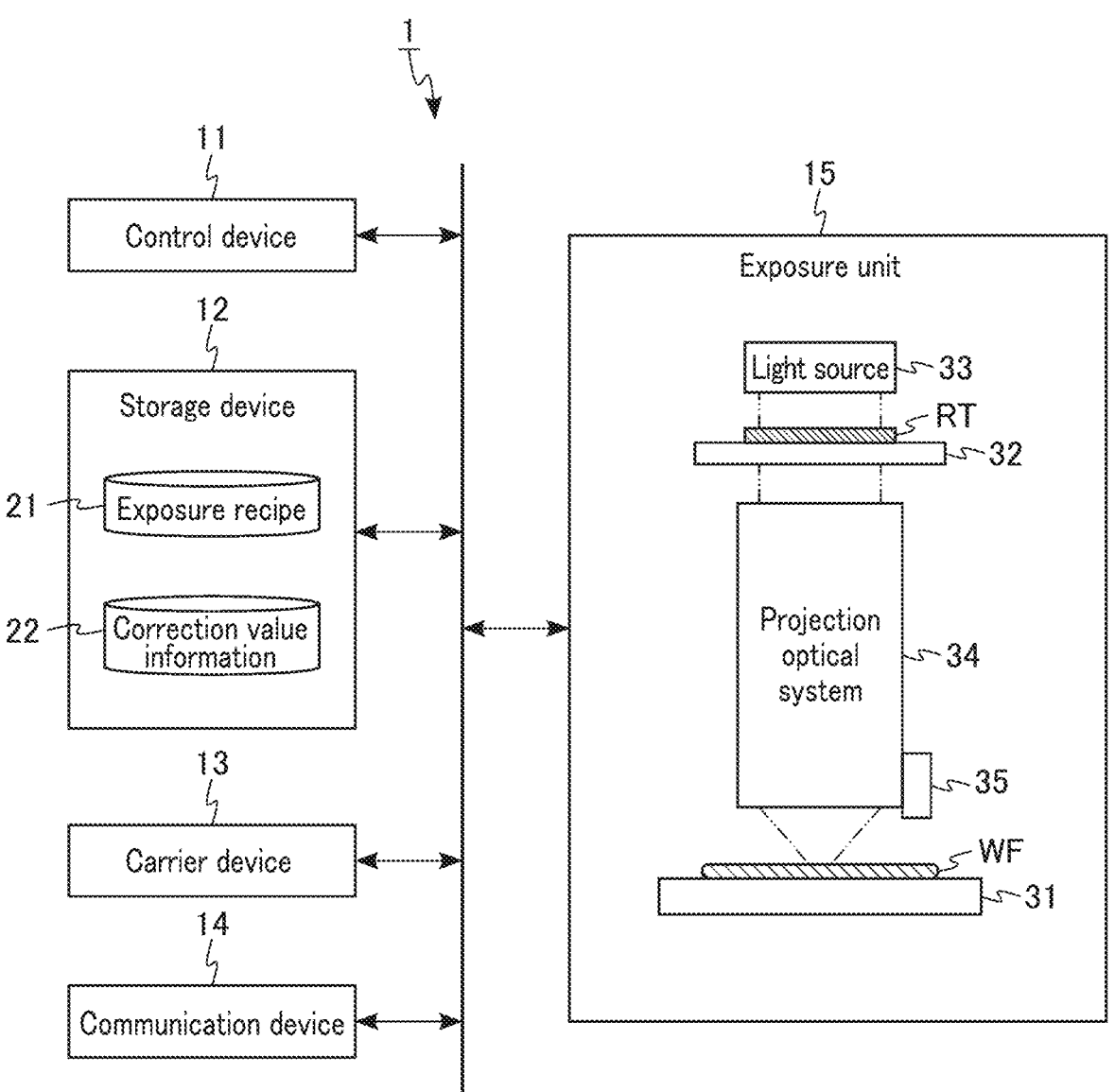
F I G. 4

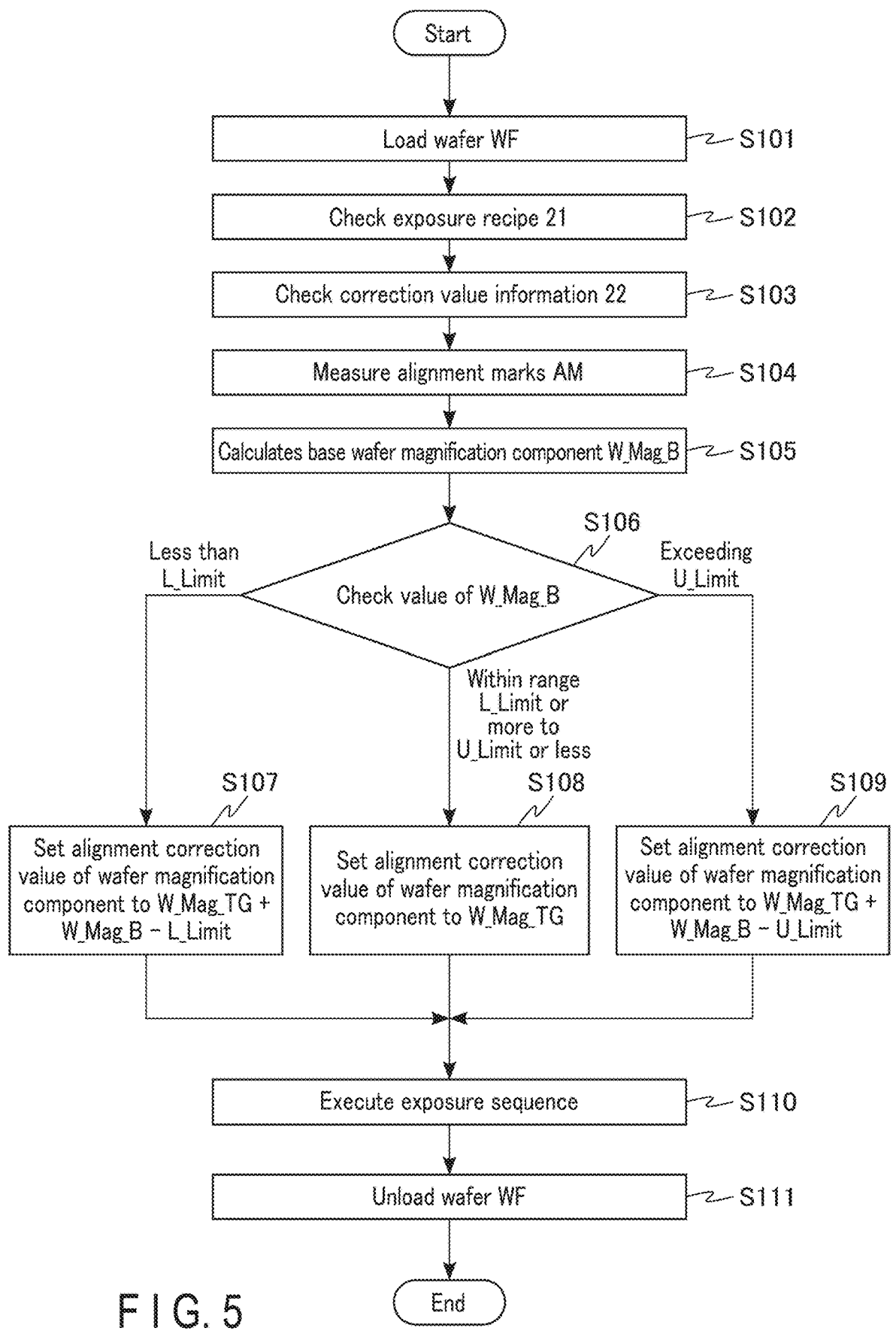
F I G. 5

F I G. 6

| No. | Alignment measurement value (Base wafer magnification component) | Applied alignment correction value of wafer magnification component | Overlay deviation prediction value |
|---|---|---|---|
| 1 | 2.3ppm | 0.5ppm | −1.8ppm |
| 2 | −1.1ppm | 0.5ppm | 1.6ppm |
| 3 | 1.2ppm | 0.5ppm | −0.7ppm |
| 4 | 3.2ppm  Upper limit NG | 1.2ppm | −2.0ppm |
| 5 | 1.6ppm | 0.5ppm | −1.1ppm |
| 6 | 0.5ppm | 0.5ppm | 0ppm |
| 7 | −1.4ppm | 0.5ppm | 1.9ppm |
| 8 | −2.3ppm  Lower limit NG | −0.3ppm | 2.0ppm |
| 9 | −0.3ppm | 0.5ppm | 0.8ppm |
| 10 | 1.5ppm | 0.5ppm | −1.0ppm |

W_Mag_TG : 0.5ppm
U_Limit : 2.5ppm
L_Limit : −1.5ppm

F I G. 7

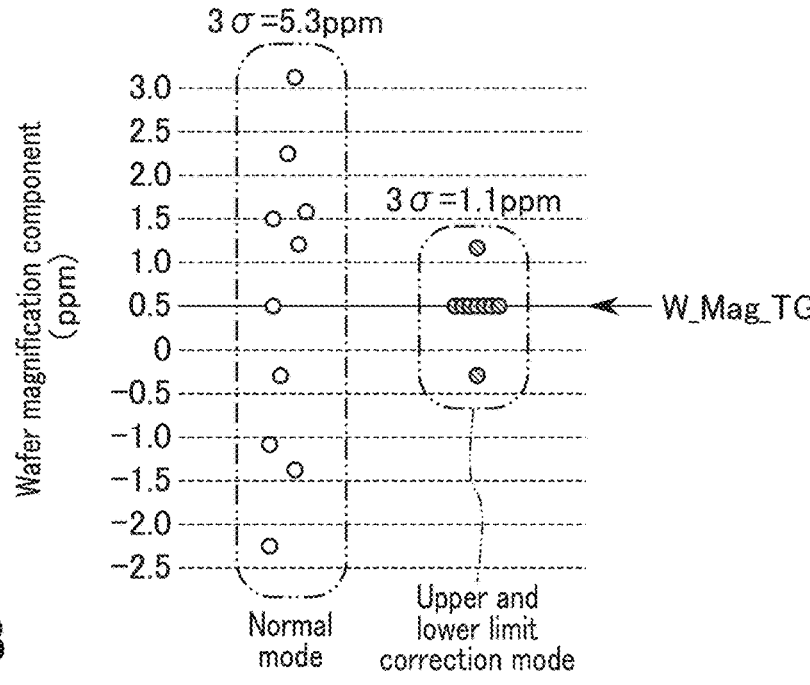

F I G. 8

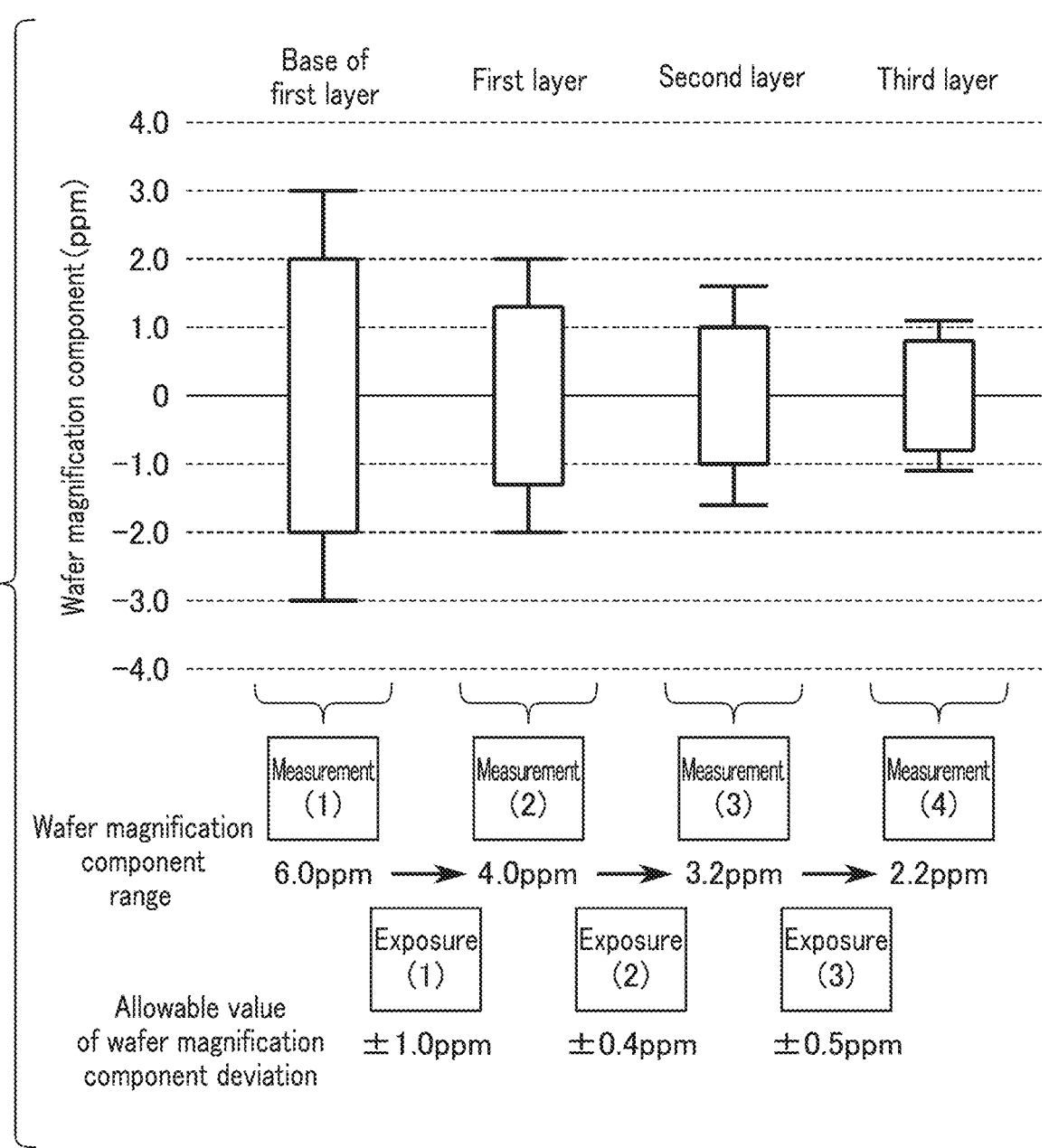
F I G. 10

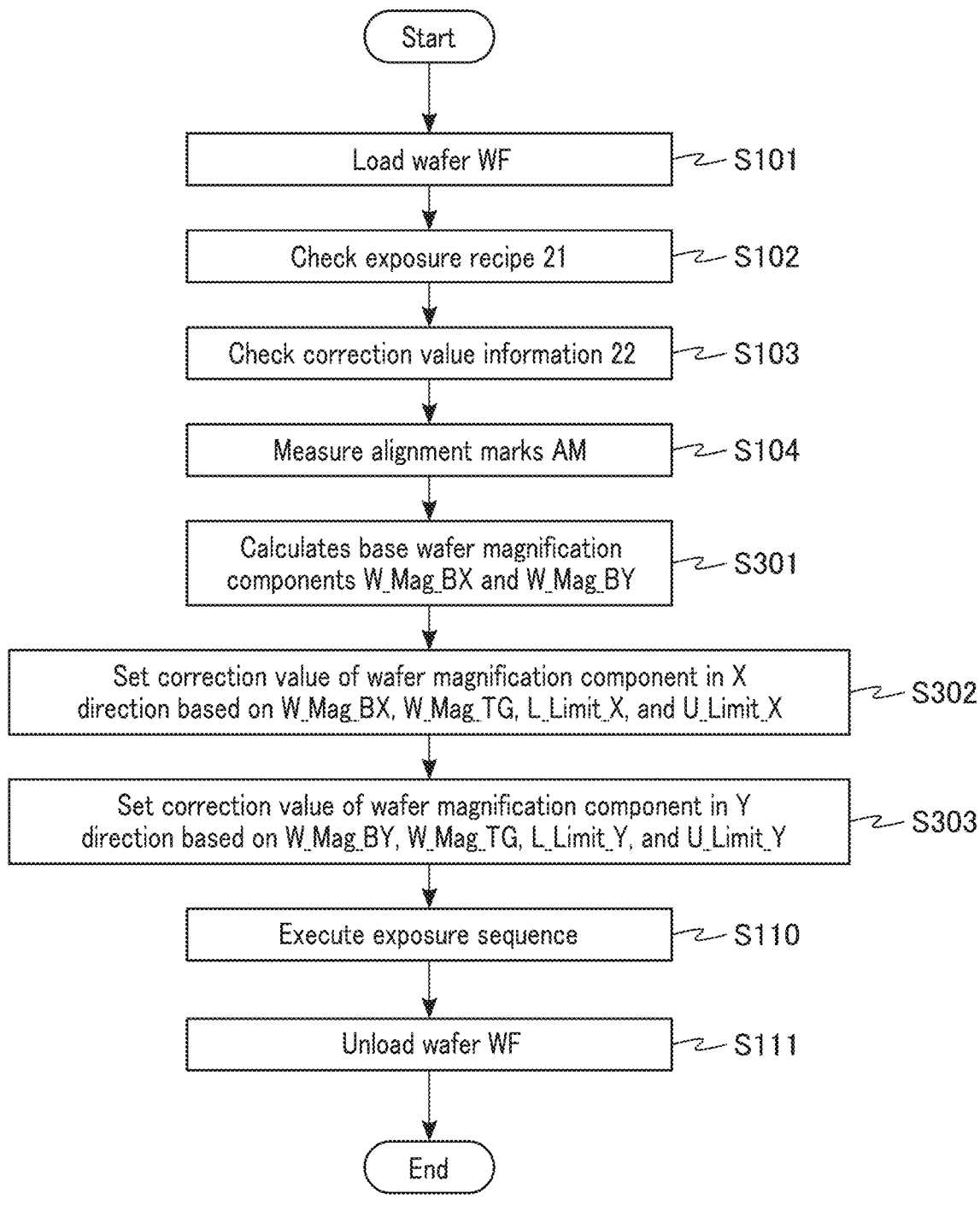

Start

Load wafer WF ~ S101

Check exposure recipe 21 ~ S102

Check correction value information 22 ~ S103

Measure alignment marks AM ~ S104

Calculates base wafer magnification components W_Mag_BX and W_Mag_BY ~ S301

Set correction value of wafer magnification component in X direction based on W_Mag_BX, W_Mag_TG, L_Limit_X, and U_Limit_X ~ S302

Set correction value of wafer magnification component in Y direction based on W_Mag_BY, W_Mag_TG, L_Limit_Y, and U_Limit_Y ~ S303

Execute exposure sequence ~ S110

Unload wafer WF ~ S111

End

F I G. 11

| Base shot shape | Shot shape of exposure process (Upper limit: 1 ppm, Lower limit: −1 ppm) | | |
| --- | --- | --- | --- |
| | X normal/Y upper and lower limit correction | X upper and lower limit correction/Y normal | X/Y upper and lower limit correction |
| Wafer magnification component 2ppm | Correction value X/Y : 2/1ppm OL deviation X/Y : 0/−1ppm | Correction value X/Y:1/2ppm OL deviation X/Y : −1/0ppm | Correction value X/Y:1/1ppm OL deviation X/Y:−1/−1ppm |
| Wafer magnification component 1ppm | Correction value X/Y : 1/0ppm OL deviation X/Y : 0/−1ppm | Correction value X/Y: 0/1ppm OL deviation X/Y : −1/0ppm | Correction value X/Y: 0/0ppm OL deviation X/Y:−1/−1ppm |
| Wafer magnification component 0ppm | Correction value X/Y : 0/0ppm OL deviation X/Y : 0/0ppm | Correction value X/Y:0/0ppm OL deviation X/Y : 0/0ppm | Correction value X/Y:0/0ppm OL deviation X/Y:0/0ppm |
| Wafer magnification component −1ppm | Correction value X/Y:−1/0ppm OL deviation X/Y : 0/1ppm | Correction value X/Y:0/−1ppm OL deviation X/Y : 1/0ppm | Correction value X/Y:0/0ppm OL deviation X/Y : 1/1ppm |
| Wafer magnification component −2ppm | Correction value X/Y:−2/−1ppm OL deviation X/Y : 0/1ppm | Correction value X/Y:−1/−2ppm OL deviation X/Y : 1/0ppm | Correction value X/Y:−1/−1ppm OL deviation X/Y : 1/1ppm |

F I G. 12

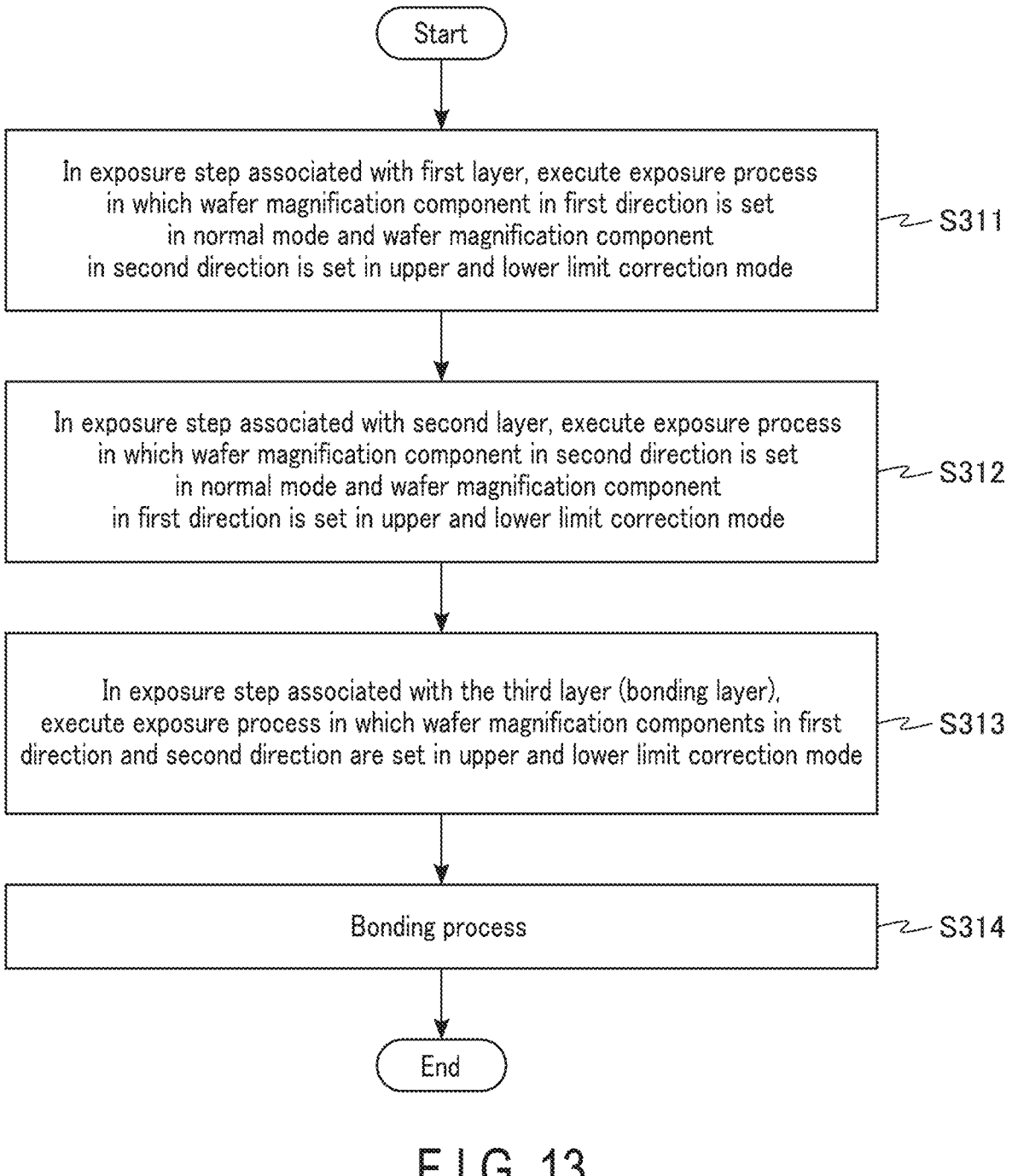

Start

In exposure step associated with first layer, execute exposure process
in which wafer magnification component in first direction is set
in normal mode and wafer magnification component
in second direction is set in upper and lower limit correction mode
~ S311

In exposure step associated with second layer, execute exposure process
in which wafer magnification component in second direction is set
in normal mode and wafer magnification component
in first direction is set in upper and lower limit correction mode
~ S312

In exposure step associated with the third layer (bonding layer),
execute exposure process in which wafer magnification components in first
direction and second direction are set in upper and lower limit correction mode
~ S313

Bonding process
~ S314

End

F I G. 13

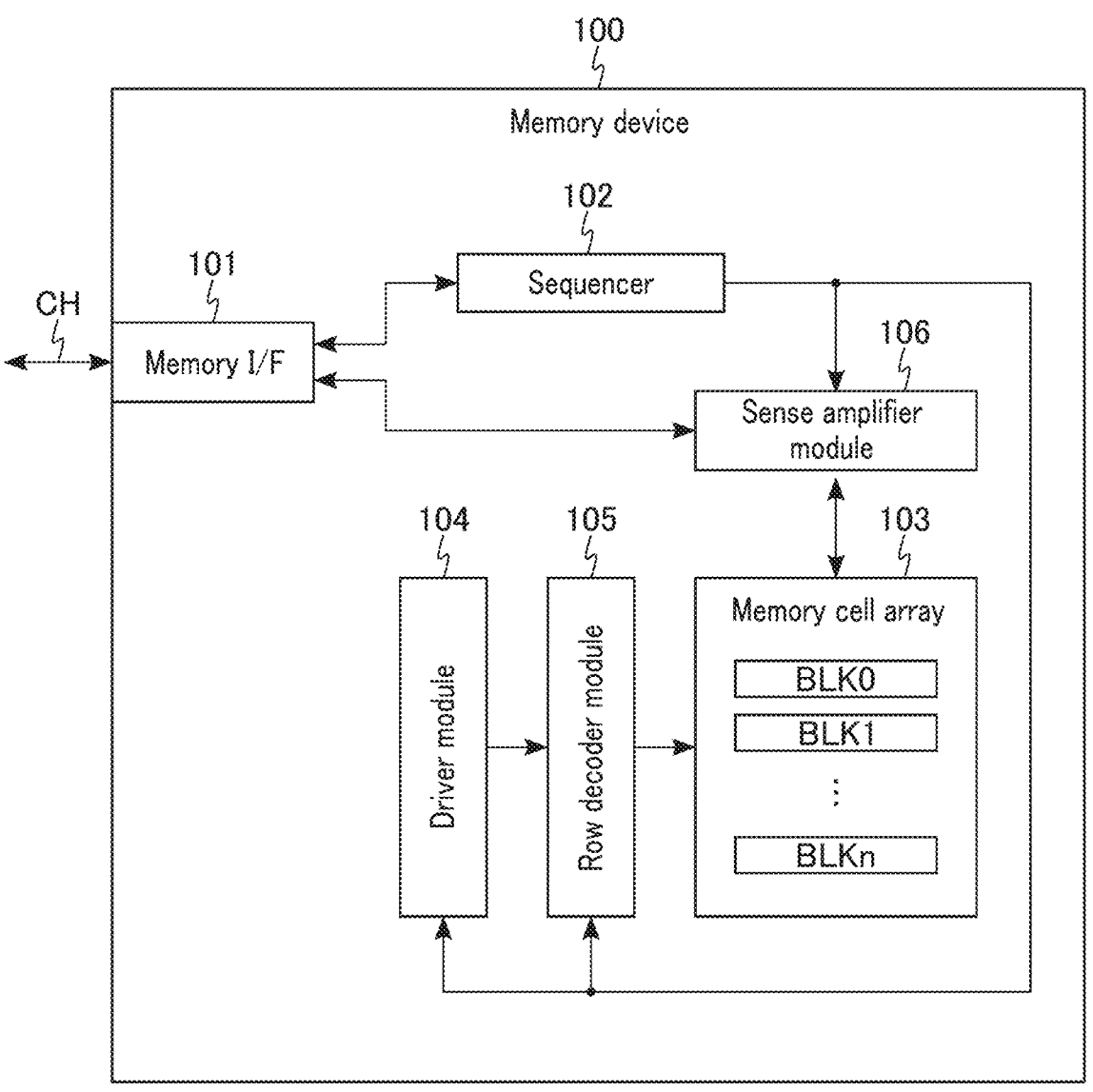
F I G. 15

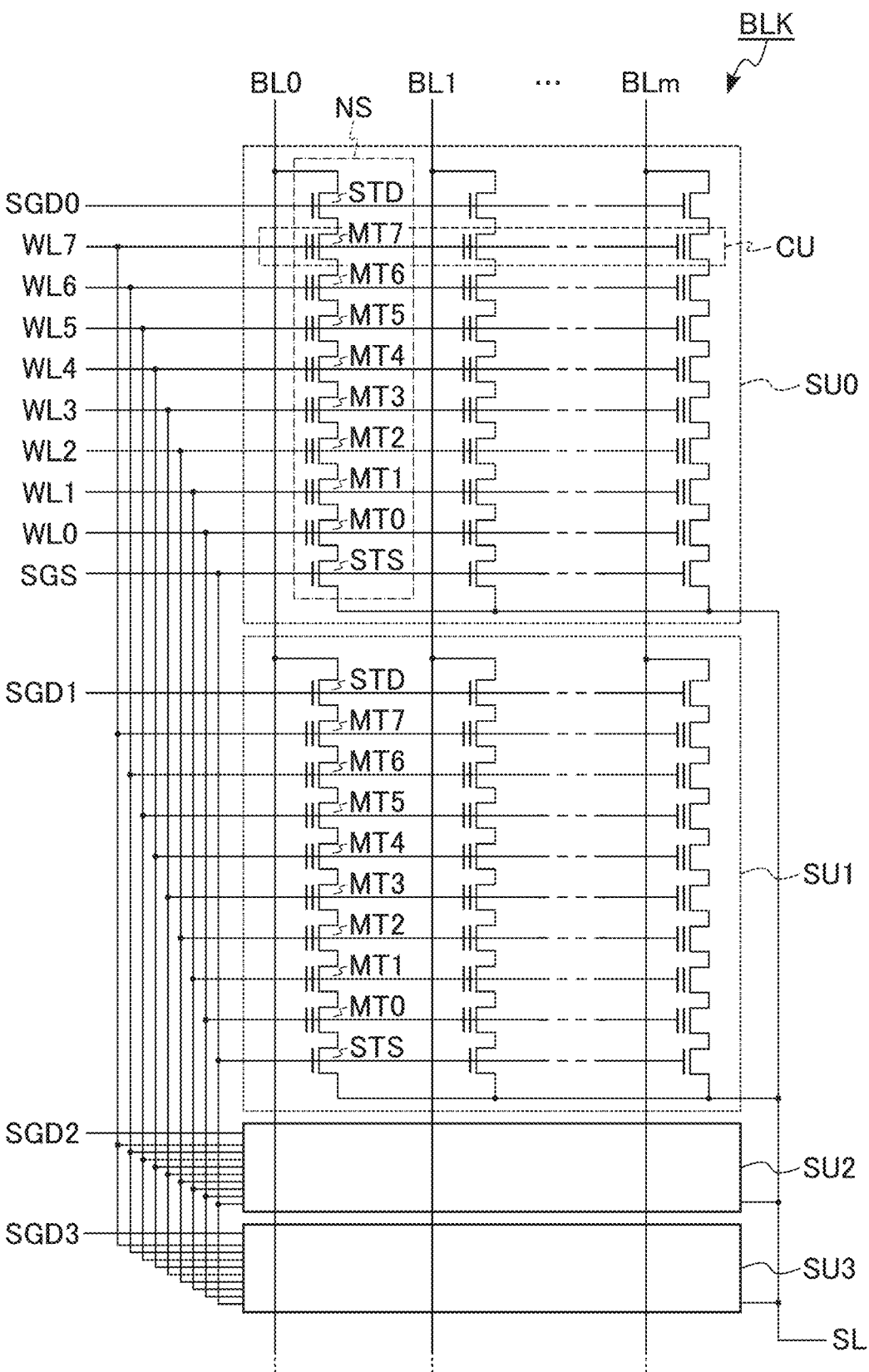
F I G. 16

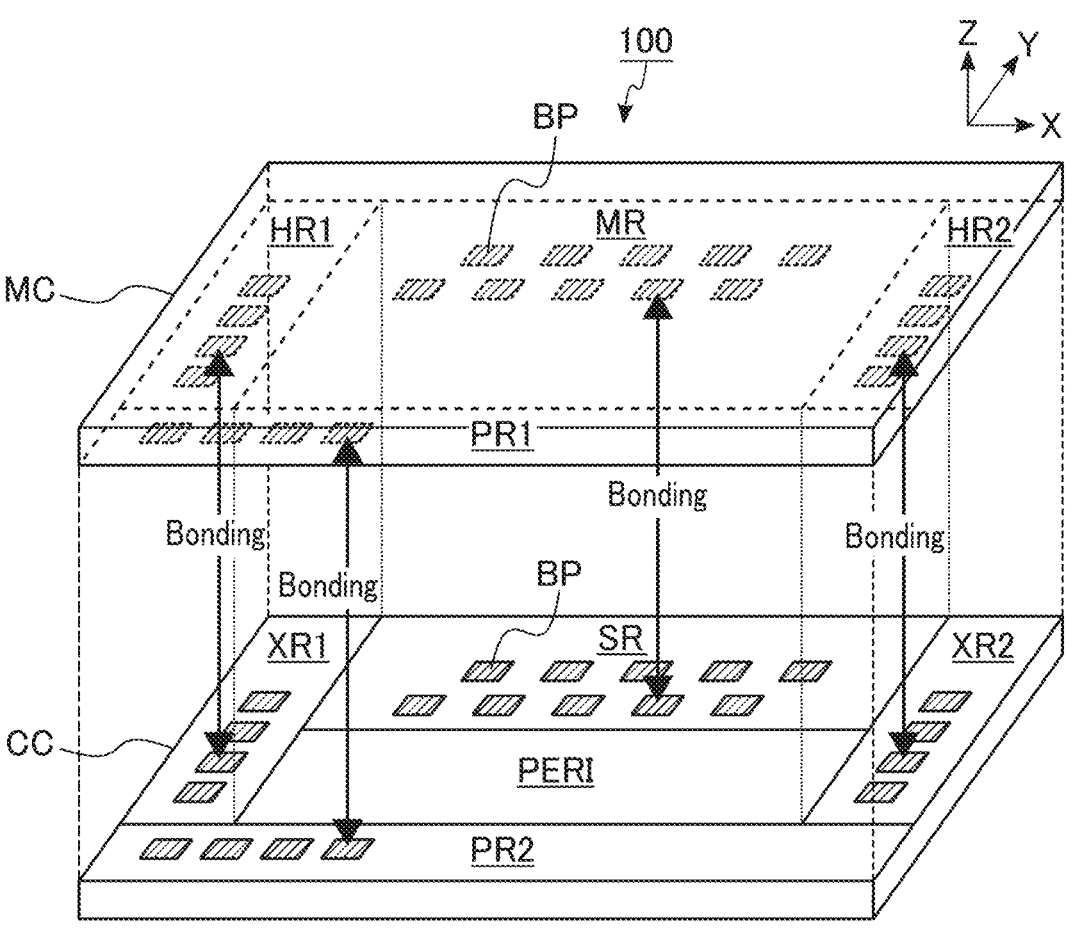
F I G. 17

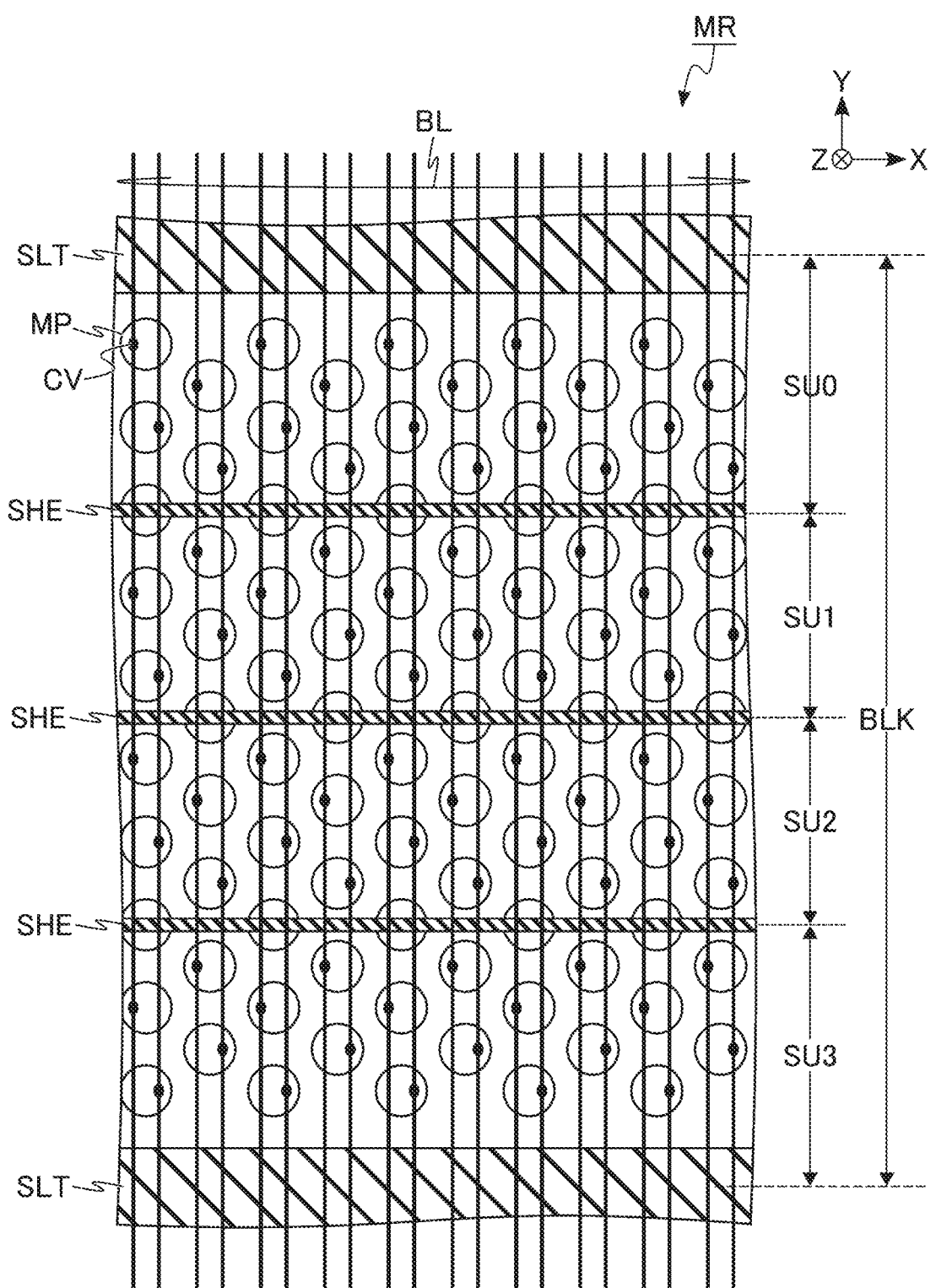
F I G. 18

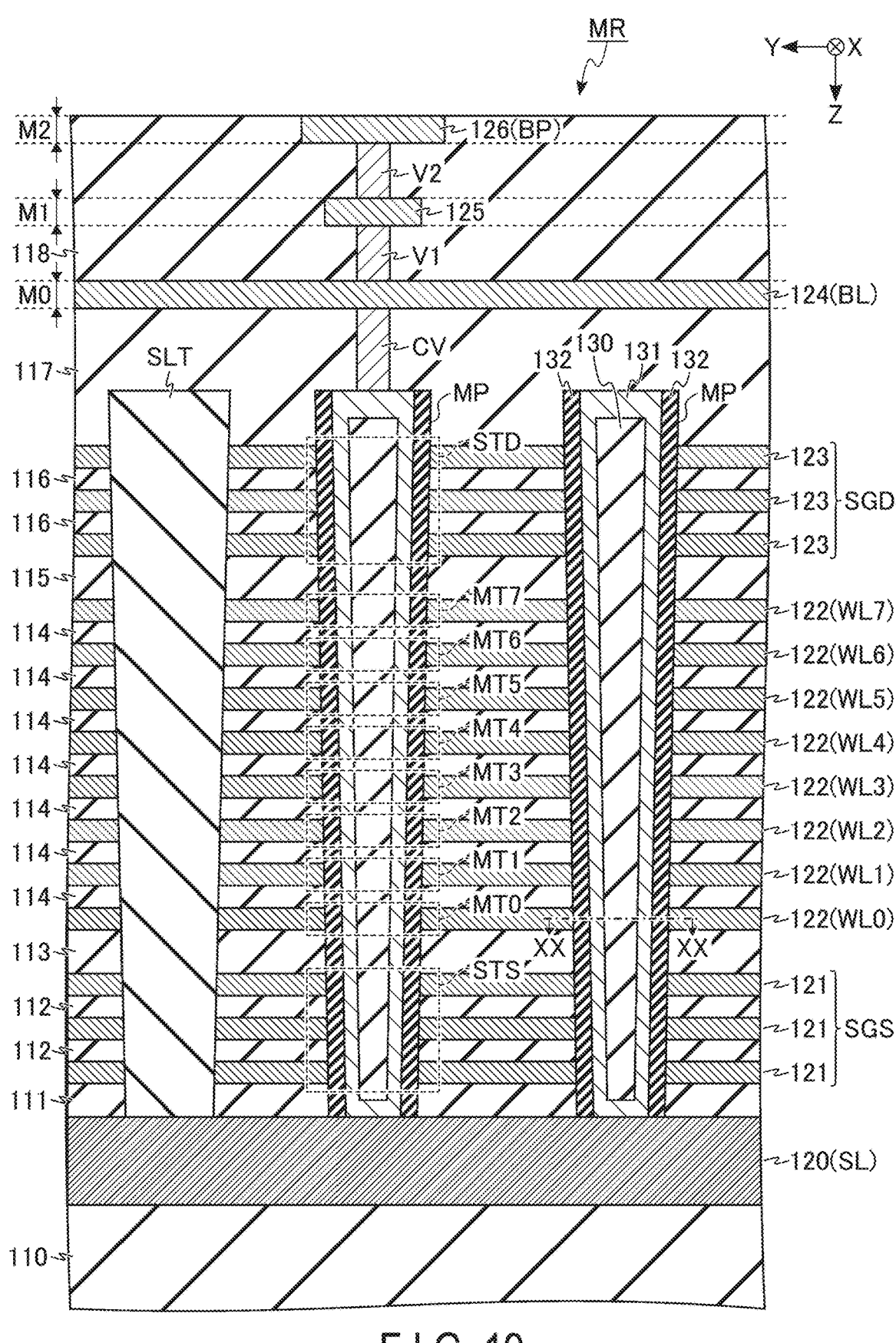
F I G. 19

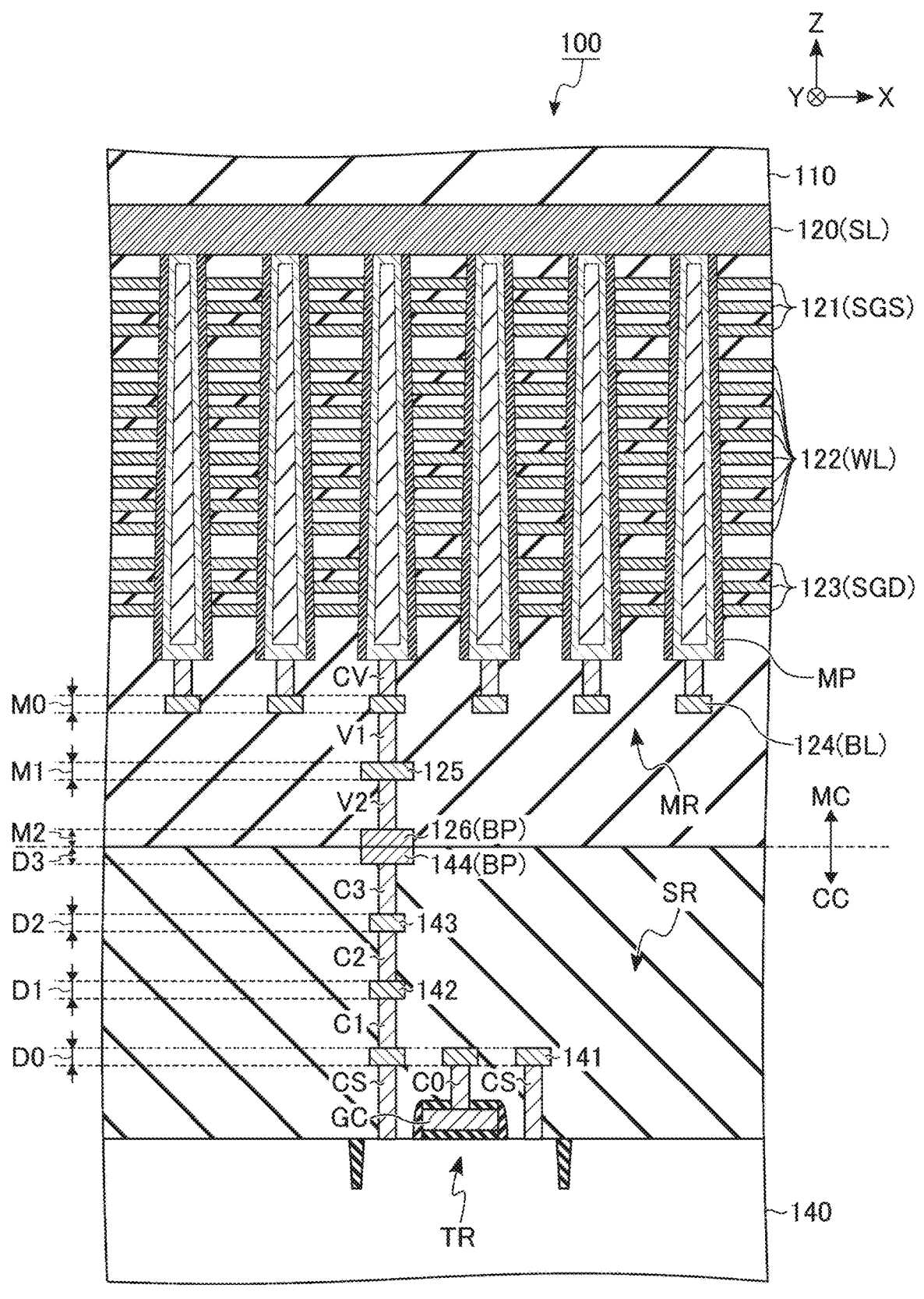
F I G. 21

EXPOSURE APPARATUS, EXPOSURE METHOD, AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2023-098698, filed Jun. 15, 2023, the entire contents of which are incorporated herein by reference.

FIELD

Embodiments described herein relate generally to an exposure apparatus, an exposure method, and a method for manufacturing a semiconductor device.

BACKGROUND

A three-dimensional stacking technique for three-dimensionally stacking semiconductor circuit substrates is known.

BRIEF DESCRIPTION OF THE DRAWINGS

FIG. 1 is a schematic diagram illustrating an outline of a method for manufacturing a semiconductor device.

FIG. 2 is a schematic diagram illustrating an example of arrangement of alignment marks used in semiconductor device manufacturing steps.

FIG. 3 is a table illustrating an example of correction performance of an exposure apparatus and a bonding apparatus with respect to an overlay component in a wafer surface that can remain in a bonding overlay.

FIG. 4 is a block diagram illustrating an example of a configuration of an exposure apparatus according to a first embodiment.

FIG. 5 is a flowchart illustrating an example of an exposure method of the exposure apparatus according to the first embodiment.

FIG. 6 is a schematic diagram illustrating an example of overlay results by an exposure process of the exposure apparatus according to the first embodiment.

FIG. 7 is a table illustrating an example of an alignment correction value of a wafer magnification component by the exposure process of the exposure apparatus according to the first embodiment.

FIG. 8 is a scatter diagram illustrating an example of distribution of the wafer magnification component after the exposure process of the exposure apparatus according to the first embodiment.

FIG. 10 is a box-and-whisker diagram showing an example of a change in distribution of a wafer magnification component by the method for manufacturing a semiconductor device according to the second embodiment.

FIG. 11 is a flowchart illustrating an example of an exposure method of an exposure apparatus according to a third embodiment.

FIG. 12 is a schematic diagram illustrating an example of overlay results by an exposure process of the exposure apparatus according to the third embodiment.

FIG. 13 is a flowchart illustrating an example of the method for manufacturing a semiconductor device according to the third embodiment.

FIG. 15 is a block diagram illustrating an example of a whole configuration of a memory device according to a fourth embodiment.

FIG. 16 is a circuit diagram illustrating an example of a circuit configuration of a memory cell array included in the memory device according to the fourth embodiment.

FIG. 17 is a perspective view illustrating an example of a structure of the memory device according to the fourth embodiment.

FIG. 18 is a plan view illustrating an example of a planar layout of the memory cell array included in the memory device according to the fourth embodiment.

FIG. 19 is a cross-sectional view illustrating an example of a cross-sectional structure of the memory cell array included in the memory device according to the fourth embodiment.

FIG. 21 is a cross-sectional view illustrating an example of a cross-sectional structure of the memory device according to the fourth embodiment.

DETAILED DESCRIPTION

Figure 9:
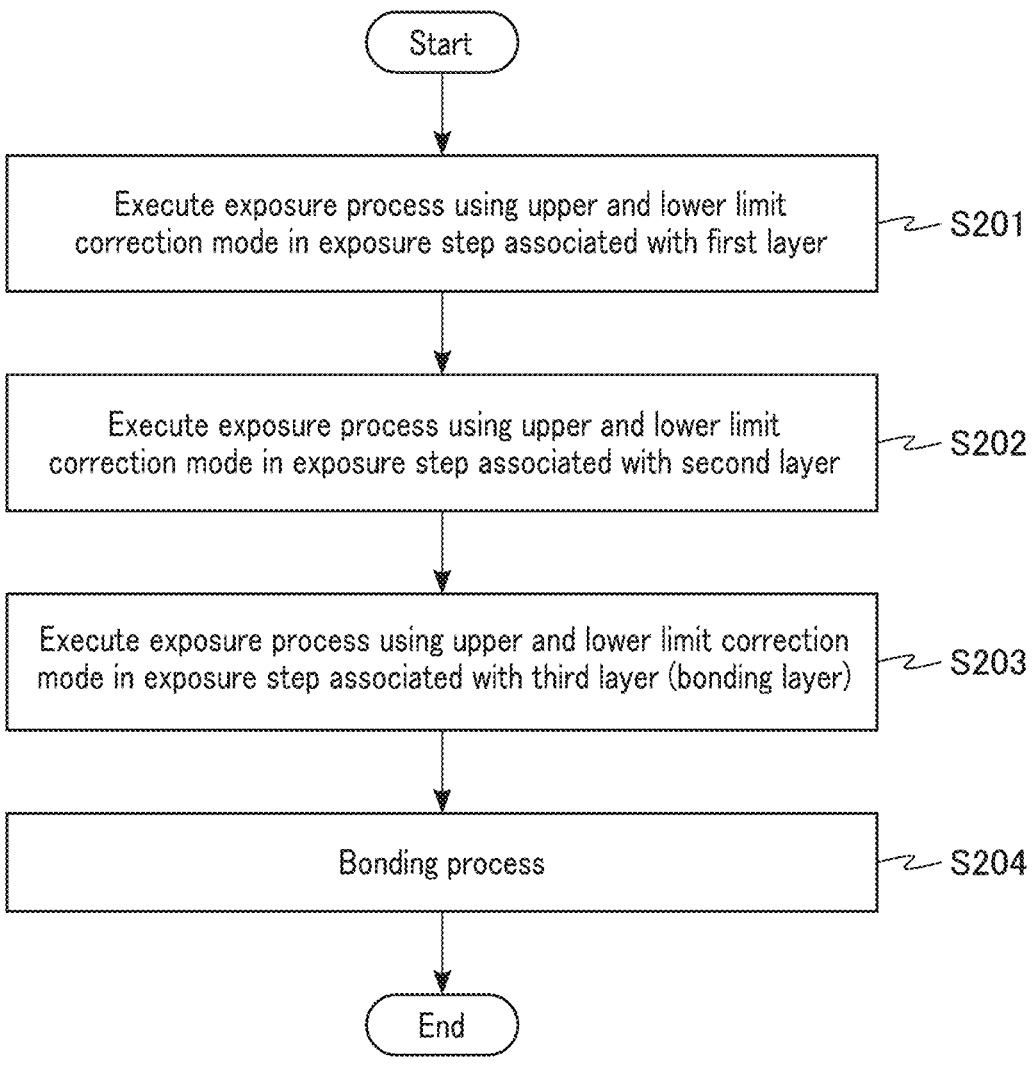
FIG. 9 is a flowchart illustrating an example of a method for manufacturing a semiconductor device according to a second embodiment.

In general, according to one embodiment, an exposure apparatus includes a stage and a control device. The stage is configured to hold a substrate. The control device is configured to execute an exposure process on the substrate. In the exposure process, the control device is further configured to: calculate a calculated value of a magnification component by performing function approximation on measurement results of three or more alignment marks arranged on the substrate in an orthogonal coordinate system; set a first lower limit value and/or a first upper limit value for an alignment correction value of a magnification component; in a case where the calculated value is larger than or equal to the first lower limit value and/or less than or equal to the first upper limit value, set the alignment correction value of the magnification component to a first correction value; in a case where the first lower limit value is set and the calculated value is less than the first lower limit value, set the alignment correction value of the magnification component to a second correction value that is larger than the calculated value and smaller than the first correction value; and in a case where the first upper limit value is set and the calculated value exceeds the first upper limit value, set the alignment correction value of the magnification component to a third correction value that is larger than the first correction value and smaller than the calculated value.

Hereinafter, each of the embodiments will be described with reference to the drawings. Each of the embodiments exemplifies an apparatus and a method for embodying the technical concepts of the invention. The drawings are schematic or conceptual. Dimensions, ratios, and the like of each drawing are not necessarily the same as the actual dimensions, ratios, and the like. Where appropriate, illustrations of configurations are omitted. In the present specification, constituent elements having substantially the same functions and configurations have the same reference signs assigned thereto. Numerals and the like appended to the reference signs are referred to using the same reference signs and are used to distinguish between similar elements.

In the following description, two types of horizontal directions intersecting with each other are referred to as "X direction" and "Y direction", respectively. In the following description, a plane parallel to each of the X direction and the Y direction is referred to as "XY plane". In the following description, a direction vertical to a horizontally placed substrate or the like is referred to as "Z direction". As used herein, "upper side" means vertically above a component, such as a horizontally placed layer. As used herein, "lower side" means vertically below a component, such as a horizontally placed layer. As used herein, "plane view" means that a component such as a horizontally placed layer is visually recognized from above. The "visually recognize" includes observing an object using a microscope, a camera, or the like.

The semiconductor device of the present specification is formed by bonding two semiconductor circuit substrates each having a semiconductor circuit formed thereon, and by dividing the bonded semiconductor circuit substrates into chips. Hereinafter, the semiconductor circuit substrate is referred to as "wafer". The process for bonding two wafers is referred to as "bonding process". A device that performs the bonding process is referred to as "bonding apparatus". The wafers disposed on the upper side and the lower side in the bonding process is referred to as "upper wafer UW" and "lower wafer LW", respectively. A pair of the upper wafer UW and the lower wafer LW bonded is referred to as "bonded wafer BW". The element "front surface of the wafer" corresponds to the surface on which the semiconductor circuit is formed by a front-end process. The element "back surface of the wafer" corresponds to a surface on the reverse side of the front surface of the wafer.

<0> Method for Manufacturing Semiconductor Device

FIG. 1 is a schematic diagram illustrating an outline of a method for manufacturing a semiconductor device. The following is an explanation on outline of process flow of the method for manufacturing a semiconductor device with reference to FIG. 1.

First, a wafer is allocated to a lot ("lot allocation"). A lot may include a plurality of wafers. Lots may be categorized into lots including the upper wafer UW and lots including the lower wafer LW, for example. Each upper wafer UW is associated with one lower wafer LW. Then, the front-end process is performed on each of the lot including the upper wafer UW and lot including the lower wafer LW. The front-end process includes a combination of "exposure process", "exposure OL (overlay) measurement", and "etching process".

The exposure process is, for example, a process for transferring a mask (reticle) pattern to a wafer for in units of shots. The "shot" corresponds to a segregated region of exposure in the exposure process. The arrangement of the shots in the upper wafer UW and the arrangement of shots in the lower wafer LW are set to be identical. In the exposure process, one-shot exposure is repeatedly executed with the exposure position shifted. That is, the exposure apparatus exposes the wafer using a step-and-repeat method. Thereafter, a part of the resist material is removed by development process, and a desired pattern is transferred to the resist material. In the exposure process, the arrangement and shape of each shot are corrected based on the measurement result of the alignment mark, various correction values, and the like. As a result, the position of overlay between the base pattern and the pattern formed by the exposure process is adjusted (aligned).

The exposure OL measurement is a process for measuring overlay deviation amounts between the base pattern and the pattern of the resist material formed by the exposure process. The measurement results obtained through exposure OL measurement can be used, for example, in a determination to rework the exposure process, or to calculate alignment correction values that are to be applied to the subsequent lot, and the like.

The etching process is a process of process a member on the wafer using the resist material formed by the exposure process as a mask. By the etching process, the member on the wafer is processed into a shape based on the pattern of the resist material. The circuit pattern for each layer can be formed by a combination of such exposure process and etching process.

Note that, although not described in the present specification, the front-end process may include a heating step, a cleaning step, a film forming step, and the like. Then, by performing the front-end process of each of the upper wafer UW and the lower wafer LW, a desired semiconductor circuit is formed on the front surface of each of the upper wafer UW and the lower wafer LW ("front-end process completion"). Thereafter, the bonding process is executed using the associated set of the upper wafer UW and the lower wafer LW.

In the bonding process, the bonding apparatus holds the front surface of the upper wafer UW and the front surface of the lower wafer LW to face each other. Further, the bonding apparatus adjusts (aligns) the position of overlay between the pattern formed on the front surface of the upper wafer UW and the pattern formed on the front surface of the lower wafer LW based on the measurement result of the alignment mark. Then, the bonding apparatus brings the front surface of the upper wafer UW and the front surface of the lower wafer LW in contact with each other. As a result, the front surface of the upper wafer UW and the front surface of the lower wafer LW are bonded to form the bonded wafer BW. Thereafter, the bond OL (overlay) measurement is performed on the bonded wafer BW.

The bond OL measurement is a process for measuring the overlay deviation amount between the pattern formed on the bonded surface of the upper wafer UW and the pattern formed on the bonded surface of the lower wafer LW. The "bonding layer" corresponds to a layer in contact with a boundary portion between the upper wafer UW and the lower wafer LW. Each of the upper wafer UW and the lower wafer LW has a bonding layer. The measurement results obtained through the bond OL measurement can be used to calculate alignment correction values that are applied to the exposure process of the subsequent lot, and the like.

Thereafter, a wiring process is performed on the bonded wafer BW, and wiring and pads used for external connection with a circuit provided on the bonded wafer BW are formed. Then, the bonded wafer BW is separated for each chip by a dicing process, whereby a plurality of semiconductor devices are formed from one bonded wafer BW.

In the present specification, the alignment corresponds to the shape of the wafer in the exposure apparatus standard. The overlay deviation amount corresponds to misalignment between the pattern of overlay source and the pattern of overlay destination. That is, the component that cannot be corrected by the exposure process based on the alignment measurement results is the overlay deviation. Hereinafter, the correction value used in the alignment of the overlay position is referred to as "alignment correction value". In a case where a polynomial is used to correct the alignment, the coefficient of each term is referred to as "alignment correction coefficient". That is, the alignment correction values can be calculated based on the alignment correction coefficient for each term and the exposure position.

The overlay deviation amounts that may be generated in each of the exposure process and the bonding process can be expressed by a combination of various components. For example, the overlay (alignment) measurement results can be broken down for each K value using polynomial regression. The overlay components expressed by the K value include, for example, an offset (shift) component, a magnification component, and an orthogonality component. Formulae corresponding to the components are listed hereinbelow. Note that, in the following formulae, "x" and "y" correspond to a coordinate (X coordinate) in the X direction and a coordinate (Y coordinate) in the Y direction, respectively. The elements "dx" and "dy" corresponds to the overlay deviation amounts in the X direction and the Y direction, respectively. "K1" to "K6" correspond to respective coefficients (polynomial regression coefficients) of overlay deviation components.

An offset (shift) component in the X direction is "dx=K1".

The offset (shift) component in the Y direction is "dy=K2".

The magnification component in the X direction is "dx=K3·x".

The magnification component in the Y direction is "dy=K4·y".

An orthogonality component in the X direction is "dx=K5·y".

An orthogonality component in the Y direction is "dy=K6·x".

In the present example, the overlay deviation amount Ex in the X direction is calculated by "Ex=K1+K3·x+K5·y. The overlay deviation amount Ey in the Y direction is calculated by "Ey=K2+K4·y+K6·x". In a case where the overlay component is expressed by polynomial regression, not only K1 to K6 but also a coefficient assigned to a higher-order overlay component may be used as the polynomial regression coefficient. In addition, the above-described overlay deviation amount can be calculated in units of shots and in the plane of the wafer. Hereinafter, the overlay component of a magnification component generated in the wafer surface is also referred to as "wafer magnification component". The wafer magnification component corresponds to the size of the wafer. The overlay component randomly generated in the wafer surface is referred to as "random component".

FIG. 2 is a schematic diagram illustrating an example of arrangement of alignment marks AM used in a semiconductor device manufacturing steps. (A) of FIG. 2 illustrates arrangement of a plurality of alignment marks AM on the wafer WF, which are measured during the exposure process. (B) of FIG. 2 illustrates arrangement of a plurality of alignment marks AM on the wafer WF, which are measured during the bonding process.

As illustrated in (A) of FIG. 2, the exposure apparatus measures, during the exposure process, the alignment marks AM at multiple points arranged on the wafer WF (that is, the upper wafer UW or the lower wafer LW). The number of measured alignment marks AM is preferably three or more. The exposure apparatus can calculate the alignment correction values such as the shift component, the magnification component, and the orthogonality component in the X direction and the Y direction by performing function approximation on the measurement results of the alignment marks AM at the multiple points in the orthogonal coordinate system. In addition, the exposure apparatus can correct each of the overlay in units of shots and the overlay in the wafer surface based on the measurement results of the alignment marks AM at the multiple points.

As illustrated in (B) of FIG. 2, during the bonding process, the bonding apparatus measures, for example, three alignment marks AM_C, AM_L, and AM_R arranged on each of the upper wafer UW and the lower wafer LW. The alignment mark AM_C is disposed in the vicinity of the center of the wafer. The alignment marks AM_L and AM_R are arranged on one side and on the other side of the outer periphery of the wafer, respectively. The bonding apparatus can calculate the alignment correction values of the shift component and the rotation component based on the alignment marks AM_C, AM_L, and AM_R of each of the upper wafer UW and the lower wafer LW. The bonding apparatus can also correct the wafer magnification component common to the X direction and the Y direction by deforming the stage holding the wafer.

FIG. 3 is a table illustrating an example of correction performance of the exposure apparatus and the bonding apparatus with respect to the overlay component in the wafer surface that can remain in the bond OL. As illustrated in FIG. 3, the shift component can be corrected in both the exposure apparatus and the bonding apparatus. The wafer magnification component (XY common magnification component) common to the X direction and the Y direction can be corrected in both the exposure apparatus and the bonding apparatus. The wafer magnification component (XY differential magnification component) having a difference between the X direction and the Y direction can be corrected in the exposure apparatus. On the other hand, it is difficult to correct the XY differential magnification component in the bonding apparatus. The rotation component (orthogonality component common to the X direction and the Y direction) can be corrected in both the exposure apparatus and the bonding apparatus. The orthogonality component can be corrected in the exposure apparatus. On the other hand, it is difficult to correct the orthogonality component in the bonding apparatus. The random component can be corrected in units of shots in the exposure apparatus. On the other hand, it is difficult to correct the random component in the bonding apparatus.

For example, in the bonding process, the bonding apparatus can adjust the wafer magnification component (XY common magnification component) of the overlay between the upper wafer UW and the lower wafer LW by deforming the stage holding the lower wafer LW to increase the wafer magnification component of the lower wafer LW. However, the tendency of the random component of the overlay changes according to the deformation amount of the lower stage. Therefore, the random component of the bond OL may deteriorate according to the correction amount of the wafer magnification component by the lower stage. On the other hand, it is also conceivable to improve the bond OL by aligning the wafer magnification components of the upper wafer UW and the lower wafer LW by the exposure process at the time of pattern formation of the bonded surface. However, adjusting the wafer magnification component on the bonded surface may deteriorate the overlay between the pattern of the bonded surface and the pattern of the base in the other wafer on which the exposure process of the bonded surface is executed in accordance with the wafer magnification component of the one wafer as a reference.

<1> First Embodiment

A first embodiment relates to an exposure apparatus and an exposure method capable of improving overlay of a wafer magnification component in a bonding process and improve overlay of a bonding layer and a base thereof. Hereinafter, details of the first embodiment will be described.

<1-1> Configuration of Exposure Apparatus 1

An exposure apparatus 1 according to the first embodiment is configured to be able to transfer the wafer WF to and from the coating-development device. The "coating-development device" is a device executing a pre-process and a post-process of the exposure process. The pre-process of the exposure process includes a process for coating the wafer with a resist material (photosensitive material). The post-process of the exposure process includes a process for developing a pattern with which the wafer is exposed. Note that a plurality of semiconductor manufacturing devices may also be used as devices used in the pre-process and the post-process of the exposure process.

FIG. 4 is a block diagram illustrating an example of a configuration of the exposure apparatus 1 according to the first embodiment. As illustrated in FIG. 4, the exposure apparatus 1 includes, for example, a control device 11, a storage device 12, a carrier device 13, a communication device 14, and an exposure unit 15.

The control device 11 is a computer or the like that controls the overall operation of the exposure apparatus 1. The control device 11 controls each of the storage device 12, the carrier device 13, the communication device 14, and the exposure unit 15. Although not illustrated, the control device 11 is equipped with a central processing unit (CPU), a read only memory (ROM), a random access memory (RAN), and the like. The CPU is a processor that executes various programs relating to the control of devices. The ROM is a nonvolatile storage medium that stores a device control program. The RAM is a volatile storage medium that is used as a work area of the CPU.

The storage device 12 is a storage medium that is used for storing data, programs, and the like. The storage device 12 stores, for example, an exposure recipe 21 and correction value information 22. Note that the storage device 12 may be externally connected to the exposure apparatus 1.

The exposure recipe 21 is a table recording the setting of the exposure process. The exposure recipe 21 includes information such as the shot shape and layout, an exposure amount (dose), a focus setting, and an alignment setting for each exposure step. The setting of the alignment includes selection of a normal mode and an upper and lower limit correction mode. In the alignment in the normal mode, based on the measurement results of the plurality of alignment marks AM, the alignment is adjusted so as to approach zero within a range in which the overlay between the base pattern and the pattern of the exposure process is possible. In the alignment in the upper and lower limit correction mode, based on the measurement results of the plurality of alignment marks AM, the wafer magnification component in the exposure process target wafer is adjusted to approach the target value W_Mag_TG within a possible range while considering the upper limit value U_Limit and/or the lower limit value L_Limit.

The correction value information 22 includes information of the target value W_Mag_TG, the upper limit value U_Limit, and the lower limit value L_Limit in the step to which the upper and lower limit correction mode is applied.

The target value W_Mag_TG corresponds to the numerical value of the wafer magnification component of one of the associated sets of the upper wafer UW and the lower wafer LW for which the front-end process has already been completed. For example, the wafer magnification component of the upper wafer UW for which the front-end process has been completed is used as the target value W_Mag_TG. In this case, in the exposure process associated with the bonded surface of the lower wafer LW, the alignment correction value of the wafer magnification component at the time of alignment is adjusted to approach the wafer magnification component of the upper wafer UW while considering the upper limit value U_Limit and/or the lower limit value L_Limit.

The upper limit value U_Limit and the lower limit value L_Limit indicate the range of alignment measurement value that is allowed to adjust the wafer magnification component to the target value W_Mag_TG. The upper limit value U_Limit and the lower limit value L_Limit are based on the management specification of the overlay deviation of the wafer magnification component allowed between the base pattern and the pattern of the exposure process. The management specification may be paraphrased as "management value". The upper limit value U_Limit corresponds to a value obtained by adding the upper limit value (upper limit management value) of the management specification to the target value W_Mag_TG. The lower limit value L_Limit corresponds to a value obtained by adding the lower limit value (lower limit management value) of the management specification to the target value W_Mag_TG. The upper limit value of the management specification is a positive numerical value, and the lower limit value of the management specification is a negative numerical value. For example, in a case where the management specification is ±2 ppm, and the target value W_Mag_TG is 0.5 ppm, the upper limit value U_Limit is set to 2.5 ppm, and the lower limit value L_Limit is set to −1.5 ppm. Note that ppm represents 1 parts per million. For example, in a case where the wafer magnification component is 1 ppm as a result of alignment measurement on a wafer having a diameter of 300 mm by the exposure apparatus, it indicates that the diameter of the wafer is 300.0003 mm in the exposure apparatus standard. Similarly, in a case where the wafer magnification component is −1 ppm as a result of alignment measurement on a wafer having a diameter of 300 mm by the exposure apparatus, it indicates that the diameter of the wafer is 299.9997 mm in the exposure apparatus standard.

The carrier device 13 is a device that is equipped with a carrier arm capable of carrying a wafer WF, a transition for temporarily placing a plurality of wafers, and the like. For example, the carrier device 13 carries the wafer WF received from an external coating-development device to the exposure unit 15. In addition, after the exposure process, the carrier device 13 carries the wafer WF received from the exposure unit 15 to the external coating-development device.

The communication device 14 is a communication interface capable of connecting to the network which is not illustrated. The exposure apparatus 1 may operate according to an operation by a terminal on a network. The exposure recipe 21 and the correction value information 22 may be stored in a server on the network.

The exposure unit 15 is a set of constituent elements used in the exposure process. The exposure unit 15 includes, for example, a wafer stage 31, a reticle stage 32, a light source 33, a projection optical system 34, and a camera 35. The wafer stage 31 has a function for holding a wafer WF. The reticle stage 32 has a function for holding a reticle RT (mask). The respective stage positions of the wafer stage 31 and the reticle stage 32 can be controlled based on control by the control device 11. The light source 33 irradiates the reticle RT with generated light. The projection optical system 34 collects the light transmitted through the reticle RT onto the surface of the wafer WF. The camera 35 is an imaging mechanism that is used to measure the alignment marks AM. The wafer WF may be irradiated with light reflected from the reticle RT. In this case, the projection optical system includes a plurality of mirrors.

<1-2> Exposure Method

FIG. 5 is a flowchart illustrating an example of an exposure method of the exposure apparatus 1 according to the first embodiment. Hereinafter, with reference to FIG. 5, as an exposure method of the exposure apparatus 1 according to the first embodiment, a case where an exposure process of an exposure step in which an upper and lower limit correction mode is enabled is executed will be described.

When the completion of the pre-process for the wafer WF is reported by the coating-development device, the exposure apparatus 1 starts the exposure process (Start).

First, the exposure apparatus 1 loads a wafer WF (S101). The loaded wafer WF is held by the wafer stage 31.

Next, the exposure apparatus 1 checks the exposure recipe 21 (S102). Specifically, the control device 11 determines process conditions to be applied to the loaded wafer WF based on the exposure recipe 21. The process conditions includes, for example, the shot shape and layout, an exposure amount (dose), a focus setting, and an alignment setting. In the present example, the process conditions under which the alignment of the upper and lower limit correction mode is valid are read.

Next, the exposure apparatus 1 checks the correction value information 22 (S103). Specifically, the control device 11 acquires detailed settings of alignment in the upper and lower limit correction mode, that is, the target value W_Mag_TG, the upper limit value U_Limit, and the lower limit value L_Limit in the exposure step.

Next, the exposure apparatus 1 measures the alignment marks AM (S104). More specifically, the wafer stage 31 appropriately moves, and the camera 35 photographs a plurality of alignment marks AM arranged in predetermined positions on the wafer WF. For example, at least three alignment marks AM are photographed. The positions of the alignment marks AM to be photographed in the process of S104 is determined based on the exposure recipe 21.

Next, the exposure apparatus 1 calculates a base wafer magnification component W_Mag_B (S105). Specifically, the control device 11 calculates the base wafer magnification component W_Mag_B by performing function approximation on the measurement results of the plurality of alignment marks AM in the orthogonal coordinate system. The value of the wafer magnification component W_Mag_B can vary for each wafer WF according to process variation.

Next, the exposure apparatus 1 checks the value of the wafer magnification component W_Mag_B (S106).

In a case where the value of the wafer magnification component W_Mag_B is less than the lower limit value L_Limit (S106: less than L_Limit), the exposure apparatus 1 sets the alignment correction value of the wafer magnification component to "target value W_Mag_TG+wafer magnification component W_Mag_B−lower limit value L_Limit" (S107), and proceeds to the process of S110.

In a case where the value of the wafer magnification component W_Mag_B is within the range from the lower limit value L_Limit or more to the upper limit value U_Limit or less (S106: within the range from L_Limit or more to U_Limit or less), the exposure apparatus 1 sets the alignment correction value of the wafer magnification component to "target value W_Mag_TG" (S108), and proceeds to the process of S110.

In a case where the value of the wafer magnification component W_Mag_B exceeds the upper limit value U_Limit (S106: exceeding U_Limit), the exposure apparatus 1 sets the alignment correction value of the wafer magnification component to "target value W_Mag_TG+wafer magnification component W_Mag_B−upper limit value U_Limit" (S109), and proceeds to the process of S110.

In the process of S110, the exposure apparatus 1 executes an exposure sequence (S110). Specifically, the control device 11 controls the wafer stage 31 based on the alignment correction value of the wafer magnification component determined in any process of S107, S108, and S109, and appropriately irradiates the wafer WF with the light transmitted through the reticle RT using the light source 33.

When the process of S110 is completed, the exposure apparatus 1 unloads the wafer WF (S111). When the wafer WF is unloaded, the exposure apparatus 1 ends the exposure process (End).

Figure 6:
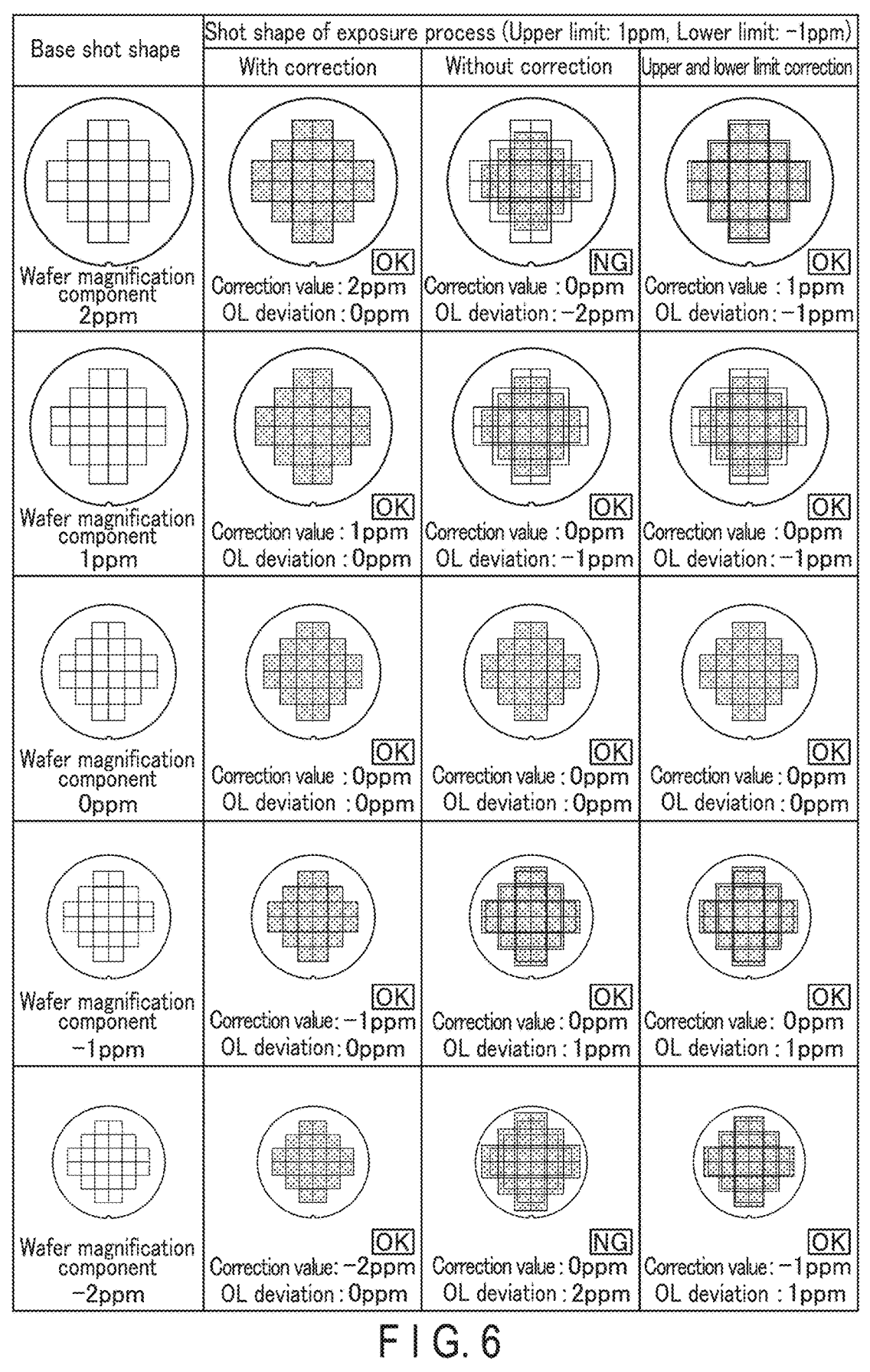

FIG. 6 is a schematic diagram illustrating an example of overlay results by the exposure process of the exposure apparatus 1 according to the first embodiment. FIG. 6 illustrates, for example, the shot shapes of the base corresponding to the wafer magnification component (five conditions of 2 ppm, 1 ppm, 0 ppm, −1 ppm, and −2 ppm) of the lower wafer LW and the shot shapes of the exposure process under three conditions of the case of "with correction", the case of "without correction", and the case of "upper and lower limit correction". In the present example, the upper limit value U_Limit is set to 1 ppm, the lower limit value L_Limit is set to −1 ppm, and the target value W_Mag_TG is set to 0 ppm.

The "with correction" corresponds to the result of the exposure process in a case where the alignment of the normal mode is applied. In a case where the base wafer magnification component is 2 ppm, 1 ppm, 0 ppm, −1 ppm, and −2 ppm, the alignment correction value of the wafer magnification component in the exposure process is set to 2 ppm, 1 ppm, 0 ppm, −1 ppm, and −2 ppm, respectively, based on the alignment measurement value of the base wafer. As a result, the overlay (exposure OL) deviation of the exposure pattern with respect to the base in each of a case where the base wafer magnification component is 2 ppm, 1 ppm, 0 ppm, −1 ppm, and −2 ppm becomes 0 ppm. Therefore, in the exposure process with correction, even in a case where the base wafer magnification component is any of 2 ppm, 1 ppm, 0 ppm, −1 ppm, and −2 ppm, the overlay (exposure OL) deviation of the wafer magnification component between the base pattern and the exposure pattern can be kept within the management specification ("OK" in FIG. 6).

The "without correction" corresponds to the result of the exposure process in a case where the correction of the wafer magnification component based on the alignment measurement value is not applied. That is, the alignment correction value of the wafer magnification component in the exposure process is set to, for example, 0 ppm based on the preset alignment correction value even in a case where the base wafer magnification component is any of 2 ppm, 1 ppm, 0 ppm, −1 ppm, and −2 ppm. The preset alignment correction value is set based on, for example, the numerical value of the wafer magnification component of the upper wafer UW. That is, in this example, the numerical value of the wafer magnification component of the upper wafer UW is 0 ppm. In this case, the overlay (exposure OL) deviation of the exposure pattern with respect to the base in a case where the base wafer magnification component is 2 ppm, 1 ppm, 0 ppm, −1 ppm, and −2 ppm is −2 ppm, −1 ppm, 0 ppm, 1 ppm, and 2 ppm, respectively. Therefore, in the exposure process without correction, in a case where the base wafer magnification component is 1 ppm, 0 ppm, and −1 ppm, the overlay deviation of the wafer magnification component between the base pattern and the exposure pattern can be kept within the management specification ("OK" in FIG. 6). On the other hand, in the exposure process without correction, in a case where the base wafer magnification component is 2 ppm and −2 ppm, the overlay deviation of the wafer magnification component between the base pattern and the exposure pattern cannot be kept within the management specification ("NG" in FIG. 6).

The "upper and lower limit correction" corresponds to the result of the exposure process in a case where the alignment of the upper and lower limit correction mode is applied. In a case where the base wafer magnification component is 2 ppm, 1 ppm, 0 ppm, −1 ppm, and −2 ppm, the alignment correction value of the wafer magnification component in the exposure process is set to 1 ppm, 0 ppm, 0 ppm, 0 ppm, and −1 ppm, respectively. Specifically, in a case where the base wafer magnification component is within the range of −1 ppm or more and 1 ppm or less, the alignment correction value of the wafer magnification component during the exposure process is set to 0 ppm based on the target value W_Mag_TG. On the other hand, in a case where the base wafer magnification component is 2 ppm, the alignment correction value of the wafer magnification component during the exposure process is set to 0 ppm (target value W_Mag_TG)+2 ppm (wafer magnification component W_Mag_B)−1 ppm (upper limit value U_Limit)=1 ppm based on the upper limit value U_Limit. Similarly, in a case where the base wafer magnification component is −2 ppm, the alignment correction value of the wafer magnification component during the exposure process is set to 0 ppm (target value W_Mag_TG)+(−2 ppm) (wafer magnification component W_Mag_B)−(−1 ppm) (lower limit value L_Limit)=1 ppm based on the lower limit value L_Limit. As a result, the overlay (exposure OL) deviation of the exposure pattern for each of the cases where the base wafer magnification component is 2 ppm, 1 ppm, 0 ppm, −1 ppm, and −2 ppm is −1 ppm, −1 ppm, 0 ppm, 1 ppm, and 1 ppm, respectively. Therefore, in the exposure process with upper and lower limit correction, even in a case where the base wafer magnification component is any of 2 ppm, 1 ppm, 0 ppm, −1 ppm, and −2 ppm, the overlay deviation of the wafer magnification component between the base pattern and the exposure pattern can be kept within the management specification ("OK" in FIG. 6).

FIG. 7 is a table illustrating an example of an alignment correction value of a wafer magnification component by the exposure process of the exposure apparatus 1 according to the first embodiment. FIG. 7 illustrates an example of a result of execution of the exposure process in which the alignment of the upper and lower limit correction mode is applied to 10 wafers WF, and illustrates an alignment measurement value (base wafer magnification component W_Mag_B), an alignment correction value of the applied wafer magnification component, and an overlay deviation prediction value for these results. In the present example, the target value W_Mag_TG is set to 0.5 ppm, the upper limit value U_Limit is set to 2.5 ppm which is 2 ppm larger than the target value W_Mag_TG, and the lower limit value L_Limit is set to −1.5 ppm which is 2 ppm lower than the target value W_Mag_TG.

As illustrated in FIG. 7, the alignment measurement values of the 10 wafers (No. 1 to No. 10) are 2.3 ppm, −1.1 ppm, 1.2 ppm, 3.2 ppm, 1.6 ppm, 0.5 ppm, −1.4 ppm, −2.3 ppm, −0.3 ppm, and 1.5 ppm, respectively. In this example, the No. 4 wafer exceeds the upper limit value U_Limit (upper limit NG), and the No. 8 wafer falls below the lower limit value L_Limit (lower limit NG).

In this case, the alignment correction value of the wafer magnification component applied to the No. 4 wafer is set to 0.5 ppm (target value W_Mag_TG)+3.2 ppm (wafer magnification component W_Mag_B) −2.5 ppm (upper limit value U_Limit)=1.2 ppm based on the process of S109. The alignment correction value of the wafer magnification component applied to the No. 8 wafer is set to 0.5 ppm (target value W_Mag_TG)+(−2.3 ppm) (wafer magnification component W_Mag_B)−(−1.5 ppm) (lower limit value L_Limit) =0.3 ppm based on the process of S107. The alignment correction value of the wafer magnification component applied to the wafers other than No. 4 and No. 7 is set to 0.5 ppm based on the process of S108.

The overlay deviation prediction values of the wafers of No. 1 to No. 10 by applying the correction of the wafer magnification component described above are −1.8 ppm, 1.6 ppm, −0.7 ppm, −2.0 ppm, −1.1 ppm, 0 ppm, 1.9 ppm, 2.0 ppm, 0.8 ppm, and −1.0 ppm, respectively. As described above, the overlay deviation prediction values of the wafers No. 1 to No. 10 fall within the management specifications. That is, the wafer magnification component of each of the No. 1 to No. 10 wafers is adjusted to a value as close as possible to the target value W_Mag_TG while the overlay deviation with respect to the base is adjusted within the management specification.

FIG. 8 is a scatter diagram illustrating an example of distribution of a wafer magnification component after the exposure process of the exposure apparatus 1 according to the first embodiment. FIG. 8 illustrates the distribution of the wafer magnification component in a case where the alignment in the normal mode is applied to the 10 wafers WF illustrated in FIG. 7 and the distribution of the wafer magnification component in a case where the alignment in the upper and lower limit correction mode is applied to the 10 wafers WF illustrated in FIG. 7. As illustrated in FIG. 8, 3σ of the wafer magnification component in a case where alignment in the normal mode is applied is 5.3 ppm. On the other hand, 3σ of the wafer magnification component in a case where the upper and lower limit correction mode is applied is 1.1 ppm. As described above, the variation in the wafer magnification component in a case where the upper and lower limit correction mode is applied is smaller than the variation in the wafer magnification component in a case where the normal mode alignment is applied.

<1-3> Advantageous Effects of First Embodiment

In the exposure process of the bonding layer, the exposure apparatus 1 according to the first embodiment executes alignment based on the base wafer magnification component W_Mag_B, the target value W_Mag_TG, the upper limit value U_Limit, and the lower limit value L_Limit. Specifically, the wafer magnification component of the bonding layer is corrected to the target value W_Mag_TG in a case where the wafer magnification component W_Mag_B is within the range of the lower limit value L_Limit or more and the upper limit value U_Limit or less. Further, the wafer magnification component of the bonding layer is corrected so as to approach the target value W_Mag_TG within the management specification of the overlay between the base pattern and the pattern of the exposure process in a case where the wafer magnification component W_Mag_B is out of the range of the upper limit value U_Limit or more and the lower limit value L_Limit or less.

As a result, the exposure apparatus 1 according to the first embodiment can correct the overlay between the bonding layer and the base thereof within a range in which the influence on the yield is small, and can suppress the variation in the wafer magnification component in the bonding layer. Adjusting the correction amount of the wafer magnification component in the bonding process to be substantially constant can suppress deterioration of the random component based on the variation in the wafer magnification component. Therefore, the exposure apparatus 1 according to the first embodiment can improve both the overlay of the bonding layer and the base thereof and the overlay of the upper wafer UW and the lower wafer LW in the bonding process, and can improve the yield of the semiconductor device.

Note that the alignment in the exposure process is usually set so as to minimize the overlay deviation between the base pattern and the pattern of the exposure process, that is, to match the calculated value of the magnification component. In addition, in a case where the target value W_Mag_TG of the wafer magnification component is set, it is assumed that the alignment correction value of the wafer magnification component is set to the target value W_Mag_TG. In contrast, the alignment correction value of the magnification component in the exposure method of the first embodiment can be different from both the target value W_Mag_TG and the calculated value (wafer magnification component W_Mag_B).

The alignment correction value of the magnification component in the first embodiment may be at least set to the first correction value (target value W_Mag_TG) in a case where the calculated value of the wafer magnification component (wafer magnification component W_Mag_B) is within the range of the lower limit value L_Limit or more and the upper limit value U_Limit or less, set to the second correction value larger than the wafer magnification component W_Mag_B and smaller than the target value W_Mag_TG in a case where the wafer magnification component W_Mag_B is less than the lower limit value L_Limit, and set to the third correction value larger than the target value W_Mag_TG and smaller than the wafer magnification component W_Mag_B in a case where the wafer magnification component W_Mag_B exceeds the upper limit value U_Limit, according to the management specification of the overlay deviation. The second correction value is more preferably a value obtained by adding the calculated value to the first correction value and further subtracting the lower limit value L_Limit. The third correction value is more preferably a value obtained by adding the calculated value to the first correction value and further subtracting the upper limit value U_Limit.

<2> Second Embodiment

A second embodiment relates to a method for manufacturing a semiconductor device in which the exposure method described in the first embodiment is applied to a plurality of layers in the vicinity of a bonding layer, and variation in a wafer magnification component with respect to a target value is suppressed in stages. In the following, details of the second embodiment will be mainly described on differences from the first embodiment.

<2-1> Method for Manufacturing Semiconductor Device

FIG. 9 is a flowchart illustrating an example of the method for manufacturing a semiconductor device according to the second embodiment. Hereinafter, as a method for manufacturing a semiconductor device according to the second embodiment, a case where the exposure process using the upper and lower limit correction mode is executed in three exposure steps for a predetermined wafer WF will be described with reference to FIG. 9.

First, in the exposure step associated with a first layer, the exposure process using the upper and lower limit correction mode is executed (S201). Next in the exposure step associated with a second layer, the exposure process using the upper and lower limit correction mode is executed (S202). Next in the exposure step associated with a third layer (bonding layer), the exposure process using the upper and lower limit correction mode is executed (S203). Then, the bonding process is executed using the wafers WF for which the respective processes of S201 to S203 have been executed (S204). When the alignment correction value is calculated in each of S201 to S203, since the wafers WF to be combined are the same, the same target value W_Mag_TG of the wafer magnification component is used. On the other hand, the upper limit value U_Limit and the lower limit value L_Limit of the wafer magnification component can be individually set for each exposure step.

FIG. 10 is a box-and-whisker diagram showing an example of a change in distribution of a wafer magnification component by the method for manufacturing a semiconductor device according to the second embodiment. FIG. 10 illustrates a change in variation of the wafer magnification component in a case where the exposure process to which the alignment of the upper and lower limit correction mode is applied is executed as described in FIG. 9 in each of the first layer to the third layer in a predetermined lot. In the present example, the target value W_Mag_TG is 0 ppm.

As illustrated in FIG. 10, the range of the wafer magnification component in the base of the first layer is 6.0 ppm (measurement (1)).

In the first layer, an allowable value (management specification) of the deviation of the wafer magnification component is ±1.0 ppm. The exposure process of the first layer is executed using the upper limit value U_Limit and the lower limit value L_Limit set based on this numerical value (exposure (1)). As a result, the range in the wafer magnification component in the first layer is improved by 2 ppm to be 4.0 ppm (measurement (2)).

In the second layer, an allowable value (management specification) of the deviation of the wafer magnification component is ±0.4 ppm. The exposure process of the second layer is executed using the upper limit value U_Limit and the lower limit value L_Limit set based on this numerical value (exposure (2)). As a result, the range in the wafer magnification component in the second layer is improved by 0.8 ppm to be 3.2 ppm (measurement (3)).

In the third layer, an allowable value (management specification) of the deviation of the wafer magnification component is ±0.5 ppm. The exposure process of the third layer is executed using the upper limit value U_Limit and the lower limit value L_Limit set based on this numerical value (exposure (3)). As a result, the range in the wafer magnification component in the third layer is improved by 1.0 ppm to be 2.2 ppm (measurement (3)).

<2-2> Advantageous Effects of Second Embodiment

As described above, the alignment in the upper and lower limit correction mode described in the first embodiment may be used for a layer other than the bonding layer, or may be used in a plurality of steps. Then, in the method for manufacturing a semiconductor device according to the second embodiment, the alignment to which the upper and lower limit correction mode is applied is executed in a plurality of steps, so that the wafer magnification component reaches the vicinity of the target value in stages.

As a result, the method for manufacturing a semiconductor device according to the second embodiment can reduce the correction amount of the overlay between the bonding layer and the base thereof, and can improve the overlay between the bonding layer and the base thereof as compared with the case of applying the alignment of the upper and lower limit correction mode only to the bonding layer. In addition, the method for manufacturing a semiconductor device according to the second embodiment can suppress the deterioration of the random component in the bonding process similarly to the first embodiment. Therefore, the method for manufacturing a semiconductor device according to the second embodiment can improve the yield of the semiconductor device.

<3> Third Embodiment

In the third embodiment, the exposure apparatus 1 is configured such that the upper limit value U_Limit and the lower limit value L_Limit of the wafer magnification component can be set independently in the X direction and the Y direction. Then, the upper limit value U_Limit and the lower limit value L_Limit in the X direction and the Y direction are set according to the overlay margins in the X direction and the Y direction, respectively, and the range in the wafer magnification component with respect to the target value is suppressed in stages. In the following, details of the third embodiment will be mainly described on differences from the first embodiment and the second embodiment.

<3-1> Exposure Method

FIG. 11 is a flowchart illustrating an example of an exposure method of the exposure apparatus according to the third embodiment. Hereinafter, with reference to FIG. 11, as an exposure method of the exposure apparatus 1 according to the third embodiment, a case where an exposure process of an exposure step in which an upper and lower limit correction mode is enabled is executed will be described.

When the completion of the pre-process for the wafer WF is reported by the coating-development device, the exposure apparatus 1 starts the exposure process (Start).

First, the exposure apparatus 1 executes the same processes as in S101 to S104 similarly to the first embodiment. That is, the exposure apparatus 1 loads the wafer WF (S101). Then, the exposure apparatus 1 checks the exposure recipe 21 (S102), and checks the correction value information 22 (S103). Then, the exposure apparatus 1 measures alignment marks AM (S104).

Next, the exposure apparatus 1 calculates base wafer magnification components W_Mag_BX and W_Mag_BY (S301). Specifically, the control device 11 calculates the base wafer magnification component (W_MagBX) in the X direction and the base wafer magnification component (W_MagBY) in the Y direction by performing function approximation on the measurement results of the plurality of alignment marks AM in the orthogonal coordinate system.

Next, the exposure apparatus 1 sets an alignment correction value of the wafer magnification component in the X direction based on the wafer magnification component W_Mag_BX, the target value W_Mag_TG, the lower limit value L_Limit_X, and the upper limit value U_Limit_X (S302). Specifically, the exposure apparatus 1 executes the processes similar to S106 to S109 in FIG. 5 for calculating the alignment correction value of the wafer magnification component in the X direction. The upper limit value U_Limit_X is a value based on the upper limit management value of the wafer magnification component in the X direction in the exposure step. The lower limit value L_Limit_X is a value based on the lower limit management value of the wafer magnification component in the X direction in the exposure step. For example, in a case where the value of W_MagBX is less than the lower limit value L_Limit_X, the exposure apparatus 1 sets the alignment correction value of the wafer magnification component in the X direction to "target value W_Mag_TG+wafer magnification component W_Mag_BX−lower limit value L_Limit_X". In a case where the value of W_MagBX is within the range of the lower limit value L_Limit_X or more and the upper limit value U_Limit_X or less, the exposure apparatus 1 sets the alignment correction value of the wafer magnification component in the X direction to "target value W_Mag_TG". In a case where the value of W_MagBX exceeds the upper limit value U_Limit_X, the exposure apparatus 1 sets the alignment correction value of the wafer magnification component in the X direction to "target value W_Mag_TG+wafer magnification component W_Mag_BX−upper limit value U_Limit_X".

Next, the exposure apparatus 1 sets an alignment correction value of the wafer magnification component in the Y direction based on the wafer magnification component W_Mag_BY, the target value W_Mag_TG, the lower limit value L_Limit_Y, and the upper limit value U_Limit_Y (S303). Specifically, the exposure apparatus 1 executes the similar processes as in S106 to S109 in FIG. 5 for calculating the alignment correction value of the wafer magnification component in the Y direction. The upper limit value U_Limit_Y is a value based on the upper limit management value of the wafer magnification component in the Y direction in the exposure step. The lower limit value L_Limit_Y is a value based on the lower limit management value of the wafer magnification component in the Y direction in the exposure step. The upper limit value U_Limit_Y may be the same as or different from the upper limit value U_Limit_X. The lower limit value L_Limit_Y may be the same as or different from the lower limit value L_Limit_X. For example, in a case where the value of W_MagBY is less than the lower limit value L_Limit_Y, the exposure apparatus 1 sets the alignment correction value of the wafer magnification component in the Y direction to "target value W_Mag_TG+Wafer magnification component W_Mag_BY−lower limit value L_Limit_Y". In a case where the value of W_MagBY is within the range of the lower limit value L_Limit_Y or more and the upper limit value U_Limit_Y or less, the exposure apparatus 1 sets the alignment correction value of the wafer magnification component in the Y direction to "target value W_Mag_TG". In a case where the value of W_MagBY exceeds the upper limit value U_Limit_Y, the exposure apparatus 1 sets the alignment correction value of the wafer magnification component in the Y direction to "target value W_Mag_TG+wafer magnification component W_Mag_BY–upper limit value U_Limit_Y".

Next, the exposure apparatus 1 executes an exposure sequence similarly to the first embodiment (S110). Specifically, the control device 11 controls a wafer stage 31 based on the alignment correction value of the wafer magnification component determined in the processes of S302 and S303, and appropriately irradiates the wafer WF with the light transmitted through the reticle RT using a light source 33.

When the process of S110 is completed, the exposure apparatus 1 unloads the wafer WF (S111). When the wafer WF is unloaded, the exposure apparatus 1 ends the exposure process (End).

In the processes of S302 and S303, a common component (wafer magnification component W_Mag_B) of the wafer magnification components in the X direction and the Y direction may be used as the value of the base wafer magnification component. The upper and lower limit correction mode may be applied to the calculation of the alignment correction value of one of the wafer magnification component of the X direction and the Y direction, and the normal mode may be applied to the calculation of the alignment correction value of the other wafer magnification component. In this case, one of S302 and S303 is omitted. Further, in the upper and lower limit correction mode, the alignment in a case where each of the upper limit value and the lower limit value of the management specification is substantially zero is similar to that in the normal mode. That is, in the upper and lower limit correction mode, the exposure apparatus 1 can execute alignment to which the upper and lower limit correction mode is applied substantially only in one direction by setting the upper limit value and the lower limit value of one of the management specifications in the X direction and the Y direction to substantially zero and appropriately setting the upper limit value and the lower limit value of the other of the management specifications in the X direction and the Y direction.

FIG. 12 is a schematic diagram illustrating an example of overlay results by the exposure process of the exposure apparatus according to the third embodiment. FIG. 12 illustrates the shot shape of the base corresponding to the wafer magnification component (five conditions of 2 ppm, 1 ppm, 0 ppm, −1 ppm, and −2 ppm) and the shot shape of the exposure process under three conditions of the case of "X normal/Y upper and lower limit correction", the case of "X upper and lower limit correction/Y normal", and the case of "X/Y upper and lower limit correction". In the present example, the upper limit values U_Limit_X and U_Limit_Y are set to 1 ppm, the lower limit values L_Limit_X and L_Limit_Y are set to −1 ppm, and the target value W_Mag_TG is set to 0 ppm. Hereinafter, the alignment correction value of the wafer magnification component in the X direction/Y direction in the exposure process is referred to as "correction value X/Y". The overlay deviation of the exposure pattern in the X direction/Y direction is referred to as "OL deviations X/Y".

The "X normal/Y upper and lower limit correction" corresponds to the result of the exposure process in a case where the alignment of the normal mode is applied in the X direction and the alignment of the upper and lower limit correction mode is applied in the Y direction. In a case where the base wafer magnification component is 2 ppm, 1 ppm, 0 ppm, −1 ppm, and −2 ppm, the correction value X/Y is set to 2/1 ppm, 1/0 ppm, 0/0 ppm, −1/0 ppm, and −2/−1 ppm, respectively.

Specifically, the alignment correction value of the wafer magnification component in the X direction is set to the same value as the base wafer magnification component in the X direction based on the application of the alignment in the normal mode. On the other hand, the alignment correction value of the wafer magnification component in the Y direction is set to 0 ppm based on the target value W_Mag_TG in a case where the base wafer magnification component in the Y direction is in the range of −1 ppm or more and 1 ppm or less. In a case where the base wafer magnification component in the Y direction is 2 ppm, the alignment correction value of the wafer magnification component in the Y direction is set to 0 ppm (target value W_Mag_TG)+2 ppm (wafer magnification component W_Mag_B)−1 ppm (upper limit value U_Limit_Y)=1 ppm based on being exceeding the upper limit value U_Limit_Y. In a case where the base wafer magnification component is −2 ppm, the alignment correction value of the wafer magnification component in the Y direction is set to 0 ppm (target value W_Mag_TG)+(−2 ppm) (wafer magnification component W_Mag_B)−(−1 ppm) (lower limit value L_Limit_Y)=−1 ppm based on being less than the lower limit value L_Limit_Y. As a result, the OL deviations X/Y for the case where the base wafer magnification component is 2 ppm, 1 ppm, 0 ppm, −1 ppm, and −2 ppm are 0/−1 ppm, 0/−1 ppm, 0/0 ppm, 0/1 ppm, and 0/1 ppm, respectively. Therefore, in the exposure process in the case of X normal/Y upper and lower limit correction, even in a case where the base wafer magnification component is any of 2 ppm, 1 ppm, 0 ppm, −1 ppm, and −2 ppm, the overlay deviation of the wafer magnification component between the base pattern and the exposure pattern can be kept within the management specification.

The "X upper and lower limit correction/Y normal" corresponds to the result of the exposure process in a case where the alignment of the upper and lower limit correction mode is applied in the X direction and the alignment of the normal mode is applied in the Y direction. In a case where the base wafer magnification component is 2 ppm, 1 ppm, 0 ppm, −1 ppm, and −2 ppm, the correction value X/Y is set to 1/2 ppm, 0/1 ppm, 0/0 ppm, 0/−1 ppm, and −1/−2 ppm, respectively.

Specifically, the alignment correction value of the wafer magnification component in the Y direction is set to the same value as the base wafer magnification component in the Y direction based on the application of the alignment in the normal mode. On the other hand, the alignment correction value of the wafer magnification component in the X direction is set to 0 ppm based on the target value W_Mag_TG in a case where the base wafer magnification component in the X direction is in the range of −1 ppm or more and 1 ppm or less. In a case where the base wafer magnification component in the X direction is 2 ppm, the alignment correction value of the wafer magnification component in the X direction is set to 0 ppm (target value W_Mag_TG)+2 ppm (wafer magnification component W_Mag_B)−1 ppm (upper limit value U_Limit_X)=1 ppm based on being more than the upper limit value U_Limit_X. In a case where the base wafer magnification component is −2 ppm, the alignment correction value of the wafer magnification component in the X direction is set to 0 ppm (target value W_Mag_TG)+(−2 ppm) (wafer magnification component W_Mag_B)−(−1 ppm) (lower limit value L_Limit_X)=−1 ppm based on the lower limit value L_Limit_X. As a result, the OL deviations X/Y for the case where the base wafer magnification component is 2 ppm, 1 ppm, 0 ppm, −1 ppm, and −2 ppm are −1/0 ppm, −1/0 ppm, 0/0 ppm, 1/0 ppm, and 1/0 ppm, respectively. Therefore, in the exposure process in the case of X upper and lower limit correction/Y normal, even in a case where the base wafer magnification component is any of 2 ppm, 1 ppm, 0 ppm, −1 ppm, and −2 ppm, the overlay deviation of the wafer magnification component between the base pattern and the exposure pattern can be kept within the management specification.

The "X/Y upper and lower limit correction" corresponds to the result of the exposure process in a case where the alignment of the upper and lower limit correction mode is applied in each of the X direction and the Y direction. In a case where the base wafer magnification component is 2 ppm, 1 ppm, 0 ppm, −1 ppm, and −2 ppm, the correction value X/Y is set to 1/1 ppm, 0/0 ppm, 0/0 ppm, 0/0 ppm, and −1/−1 ppm, respectively. That is, the alignment correction value of the wafer magnification component used by the X/Y upper and lower limit correction is similar to a combination of the alignment correction value of the wafer magnification component in the Y direction in the case of the X normal/Y upper and lower limit correction and the alignment correction value of the wafer magnification component in the X direction in the case of the X upper and lower limit correction/Y normal. As a result, the OL deviations X/Y for the case where the base wafer magnification component is 2 ppm, 1 ppm, 0 ppm, −1 ppm, and −2 ppm are −1/−1 ppm, −1/−1 ppm, 0/0 ppm, 1/1 ppm, and 1/1 ppm, respectively. Therefore, in the exposure process in the case of X/Y upper and lower limit correction, even in a case where the base wafer magnification component is any of 2 ppm, 1 ppm, 0 ppm, −1 ppm, and −2 ppm, the overlay deviation of the wafer magnification component between the base pattern and the exposure pattern can be kept within the management specification.

<3-2> Method for Manufacturing Semiconductor Device

FIG. 13 is a flowchart illustrating an example of the method for manufacturing a semiconductor device according to the third embodiment. Hereinafter, with reference to FIG. 13, as a method for manufacturing a semiconductor device according to the third embodiment, a case will be described in which an exposure process capable of separately using a normal mode and an upper and lower limit correction mode in two directions is executed in three exposure steps for a predetermined wafer WF.

First, in the exposure step associated with the first layer, the exposure process in which the wafer magnification component in the first direction (for example, in the X direction,) is set in the normal mode and the wafer magnification component in the second direction (for example, in the Y direction,) is set in the upper and lower limit correction mode is executed (S311). Next, in the exposure step associated with the second layer, the exposure process in which the wafer magnification component in the second direction (for example, in the Y direction) is set in the normal mode and the wafer magnification component in the first direction (for example, in the X direction,) is set in the upper and lower limit correction mode is executed (S312). Next, in an exposure step associated with the third layer (bonding layer), an exposure process in which the wafer magnification components in the first direction and the second direction are set in the upper and lower limit correction mode is executed (S313). Then, the bonding process is executed using the wafers WF for which the respective processes of S311 to S313 have been executed (S314). When the alignment correction value is calculated in each of S311 to S313, since the wafers WF to be combined are the same, the same target value W_Mag_TG of the wafer magnification component is used. On the other hand, the upper limit value U_Limit and the lower limit value L_Limit of the wafer magnification component in each of the first direction and the second direction can be individually set for each exposure step.

Figure 14:
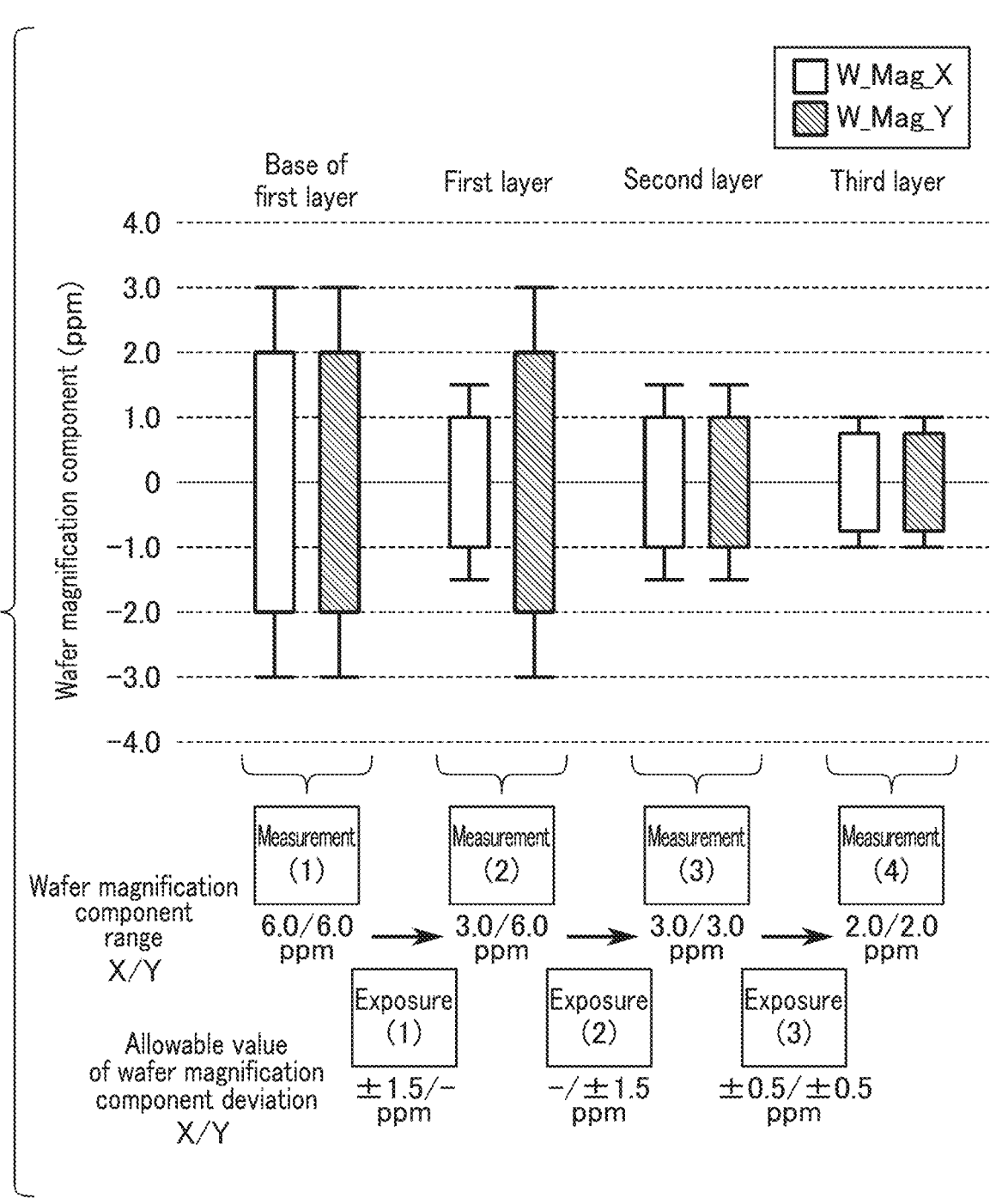
FIG. 14 is a box-and-whisker diagram showing an example of a change in distribution of a wafer magnification component by the method for manufacturing a semiconductor device according to the third embodiment.

FIG. 14 is a box-and-whisker diagram showing an example of a change in distribution of a wafer magnification component by the method for manufacturing a semiconductor device according to the third embodiment. FIG. 14 illustrates a change in variation of the wafer magnification component (W_Mag_X) in the X direction and the wafer magnification component (W_Mag_Y) in the Y direction in a case where the exposure process to which the alignment of the upper and lower limit correction mode is applied is executed as described in FIG. 13 in each of the first layer to the third layer in a predetermined lot. In the present example, the target value W_Mag_TG is 0 ppm.

As illustrated in FIG. 14, in the base of the first layer, the range of the wafer magnification component in the X direction is 6.0 ppm, and the range of the wafer magnification component in the Y direction is 6.0 ppm (measurement (1)). That is, the wafer magnification component range X/Y is 6.0/6.0 ppm.

In the first layer, the overlay with high accuracy in the Y direction is required while an allowable value (management specification) of the deviation of the wafer magnification component in the X direction is ±1.5 ppm. Therefore, in the exposure process of the first layer, the upper and lower limit correction mode is applied in the X direction and alignment to which the normal mode is applied in the Y direction is executed based on the management specification (exposure (1)). As a result, in the exposure process of the first layer, only the range in the wafer magnification component in the X direction is improved by 3.0 ppm. As a result, the wafer magnification component range X/Y after the process of the first layer is 3.0/6.0 ppm (measurement (2)).

In the second layer, the overlay with high accuracy in the X direction is required while an allowable value (management specification) of the deviation of the wafer magnification component in the Y direction is ±1.5 ppm. Therefore, in the exposure process of the second layer, the upper and lower limit correction mode is applied in the Y direction and alignment to which the normal mode is applied in the X direction is executed based on the management specification (exposure (2)). As a result, in the exposure process of the second layer, only the range in the wafer magnification component in the Y direction is improved by 3.0 ppm. As a result, the wafer magnification component range X/Y after the process of the second layer is 3.0/3.0 ppm (measurement (3)).

In the third layer, an allowable value (management specification) of the deviation of the wafer magnification component in each of the X direction and the Y direction is ±0.5 ppm. Therefore, in the exposure process of the third layer, the upper and lower limit correction mode is applied in each of the X direction and the Y direction based on the management specification (exposure (3)). As a result, in the exposure process of the third layer, the range in the wafer magnification component in each of the X direction and the Y direction is improved by 1.0 ppm. As a result, the wafer magnification component range X/Y after the process of the third layer is 2.0/2.0 ppm (measurement (4)).

Note that, in the present example, the case where the alignment in the normal mode is applied in the direction in which the overlay with high accuracy is required has been described, but the present invention is not limited thereto. Alignment in the upper and lower limit correction mode may be applied in a direction in which the overlay with high accuracy is required. In this case, the management specification in the direction in which the overlay with high accuracy is required is set to zero or a small value within a possible range.

<3-3> Advantageous Effects of Third Embodiment

As described above, the upper limit value and the lower limit value may be individually provided in each of the X direction and the Y direction in the alignment of the upper and lower limit correction mode described in the first embodiment. Then, in the method for manufacturing a semiconductor device according to the third embodiment, the alignment of the upper and lower limit correction mode is applied in a direction in which there is a margin in the management specification based on the management specification of the overlay in the X direction and the management specification of the overlay in the Y direction. Then, in the method for manufacturing a semiconductor device according to the third embodiment, the wafer magnification component is caused to reach the vicinity of the target value in stages, similarly to the second embodiment.

As a result, the method for manufacturing a semiconductor device according to the third embodiment can reduce the correction amount of the overlay between the bonding layer and the base thereof, and can improve the overlay between the bonding layer and the base thereof as compared with the case of applying the alignment of the upper and lower limit correction mode only to the bonding layer, similarly to the second embodiment. In addition, the method for manufacturing a semiconductor device according to the third embodiment can suppress the deterioration of the random component in the bonding process similarly to the first embodiment. Therefore, the method for manufacturing a semiconductor device according to the third embodiment can improve the yield of the semiconductor device.

<4> the Fourth Embodiment

The fourth embodiment relates to a specific example of a semiconductor device manufactured using the exposure method described in the above embodiments. The following is an explanation of a memory device having a bonding structure, as a specific example of the semiconductor device.

<4-1> Whole Configuration of Memory Device 100

FIG. 15 is a block diagram illustrating an example of a whole configuration of a memory device 100 according to a fourth embodiment. As illustrated in FIG. 15, the memory device 100 includes, for example, a memory interface (memory I/F) 101, a sequencer 102, a memory cell array 103, a driver module 104, a row decoder module 105, and a sense amplifier module 106.

The memory I/F 101 is a hardware interface connected to an external memory controller via a channel CH. The memory I/F 101 executes communications according to an interface standard between the memory device 100 and the memory controller. The memory I/F 101 supports, for example, the NAND interface standard.

The sequencer 102 is a control circuit controlling the whole operation of the memory device 100. The sequencer 102 controls the driver module 104, the row decoder module 105, and the sense amplifier module 106 and the like based on a command received via the memory I/F 101 to execute a read operation, a write operation, and an erase operation, and the like.

The memory cell array 103 is a storage circuit including a set of a plurality of memory cells. The memory cell array 103 includes a plurality of blocks BLK0 to BLKn (n is an integer of 1 or more). Each of the blocks BLK is used as, for example, a data erase unit. The memory cell array 103 is provided with a plurality of bit lines and a plurality of word lines. Each of the memory cells is associated with, for example, one of the bit lines BL and one of the word lines WL. Each of the memory cells is identified based on an address identifying the word line WL and an address identifying the bit line BL.

The driver module 104 is a driver circuit generating voltages used in a read operation, a write operation, and an erase operation and the like. The driver module 104 is connected to the row decoder module 105 via a plurality of signal lines. The driver module 104 is capable of varying the voltage to be applied to each of the signal lines based on the page address received via the memory I/F 101.

The row decoder module 105 is a decoder that decodes a row address received via the memory I/F 101. The row decoder module 105 selects one block BLK based on a decoding result. The row decoder module 105 transfers voltages applied to the respective signal lines to respective lines (such as word lines WL) provided in the selected block BLK.

The sense amplifier module 106 is a sense circuit that senses data read from the selected block BLK based on the voltage of the bit line BL in a read operation. The sense amplifier module 106 transmits the read data to the memory controller via the memory I/F 101. In a write operation, the sense amplifier module 106 is capable of applying the voltage corresponding to the data to be written to the memory cell for each bit line BL.

<4-2> Circuit Configuration of Memory Cell Array 103

FIG. 16 is a circuit diagram illustrating an example of a circuit configuration of the memory cell array 103 included in the memory device 100 according to the fourth embodiment. FIG. 16 illustrates one block BLK among a plurality of blocks BLK included in the memory cell array 103. As illustrated in FIG. 16, the block BLK includes, for example, four string units SU0 to SU3.

Each of the string units SU includes a plurality of NAND strings NS. The NAND strings NS are associated with bit lines BL0 to BLm (m is an integer of 1 or more), respectively. Mutually different column addresses are assigned to the respective bit lines BL0 to BLm. Each bit line BL is shared by the NAND strings NS to which the same column address is allocated among the blocks BLK. Each NAND string NS includes, for example, memory cell transistors MT0 to MT7 and select transistors STD and STS.

Each memory cell transistor MT includes a control gate and a charge storage layer, and stores data in a nonvolatile manner. The memory cell transistors MT0 to MT7 of each NAND string NS are connected in series. The control gates of the memory cell transistors MT0 to MT7 are connected to the word lines WL0 to WL7, respectively. Each of the word lines WL0 to WL7 is provided for each block BLK. A set of a plurality of memory cell transistors MT connected to the common word line WL in the same string unit SU is referred to as, for example, "cell unit CU". If each memory cell transistor MT stores 1-bit data, the cell unit CU stores "1-page data". The cell unit CU may have a storage capacity of two page data or more according to the number of bits of data stored by the memory cell transistor MT.

Each of the select transistors STD and STS is used to select the string unit SU. The drain of the select transistor STD is connected to the associated bit line BL. The source of the select transistor STD is connected to one end of the memory cell transistors MT0 to MT7 connected in series. Gates of the select transistors STD included in the string units SU0 to SU3 are connected to select gate lines SGD0 to SGD3, respectively. The drain of the select transistor STS is connected to the other end of the memory cell transistors MT0 to MT7 connected in series. The source of the select transistor STS is connected to the source line SL. The gate of the select transistor STS is connected to the select gate line SGS. The source line SL is shared by a plurality of blocks BLK, for example.

<4-3> Structure of Memory Device 100

Hereinafter, an example of the structure of the memory device 100 according to the fourth embodiment will be described. In the fourth embodiment, the X direction corresponds to, for example, the extending direction of the word line WL. The Y direction corresponds to, for example, the extending direction of the bit line BL. The Z direction corresponds to a vertical direction with respect to a front surface of a semiconductor substrate (wafer) used for forming the memory device 100.

FIG. 17 is a perspective view illustrating an example of a structure of the memory device 100 according to the fourth embodiment. As illustrated in FIG. 17, the memory device 100 includes a memory chip MC and a CMOS chip CC. The memory chip MC includes, for example, a memory region MR, hookup regions HR1 and HR2, and a pad region PR1. The CMOS chip CC includes, for example, a sense amplifier region SR, a peripheral circuit region PERI, transfer regions XR1 and XR2, and a pad region PR2.

The memory region MR includes the memory cell array 103. The hookup regions HR1 and HR2 include an interconnect or the like that is used for interconnecting the stacked interconnect provided to the memory chip MC and the row decoder module 105 provided to the CMOS chip CC. The pad region PR1 includes a pad or the like that is used for a connection between the memory device 100 and the memory controller. The hookup regions HR1 and HR2 sandwich the memory region MR in the X direction. The pad region PR1 is adjacent, in the Y direction, to the memory region MR and each of the hookup regions HR1 and HR2.

The sense amplifier region SR includes the sense amplifier module 106. The peripheral circuit region PERI includes the sequencer 102, the driver module 104, and the like. The transfer regions XR1 and XR2 include the row decoder module 105. The pad region PR2 includes the memory I/F 101. The sense amplifier region SR and the peripheral circuit region PERI are arranged adjacent to each other in the Y direction and overlap the memory region MR in the Z direction. The transfer regions XR1 and XR2 sandwich a set of the sense amplifier region SR and the peripheral circuit region PERI in the X direction, and overlap the hookup regions HR1 and HR2, respectively. The pad region PR2 overlaps the pad region PR1 of the memory chip MC in the Z direction.

The memory chip MC includes a plurality of bonding pads BP in respective lower parts of the memory region MR, the hookup regions HR1 and HR2, and the pad region PR1, respectively. The bonding pads BP of the memory region MR are connected to the associated bit lines BL. The bonding pads BP of the hookup regions HR are connected to associated interconnect (for example, word lines WL) among the stacked interconnect provided to the memory region MR. The bonding pad BP of the pad region PR1 is connected to a pad (not illustrated) provided to the upper surface of the memory chip MC. The pad provided to the upper surface of the memory chip MC is used, for example, for connection between the memory device 100 and the memory controller.

The CMOS chip CC includes a plurality of bonding pads BP in respective upper parts of the sense amplifier region SR, the peripheral circuit region PERI, the transfer regions XR1 and XR2, and the pad region PR2. The bonding pads BP of the sense amplifier region SR overlap the bonding pads BP of the memory region MR in the Z direction. The bonding pads BP of the transfer regions XR1 and XR2 overlap the bonding pads BP of the hookup regions HR1 and HR2, respectively, in the Z direction. The bonding pads BP of the pad region PR1 overlap the bonding pads BP of the pad region PR2 in the Z direction.

The memory device 100 has a structure in which the lower surface (front surface of the semiconductor substrate on which the memory chip MC is formed) of the memory chip MC and the upper surface (front surface of the semiconductor substrate on which the CMOS chip CC is formed) of the CMOS chip CC are bonded to each other. Among the bonding pads BP provided to the memory device 100, two bonding pads BP facing each other between the memory chip MC and the CMOS chip CC are electrically connected through bonding. Thus, the circuit in the memory chip MC and the circuit in the CMOS chip CC are electrically connected via the bonding pads BP. A set of two bonding pads BP facing each other between the memory chip MC and the CMOS chip CC may have a boundary or may be integrated with one another.

<4-3-1> Structure of Memory Cell Array 103

The structure of the memory cell array 103 will be explained hereinafter.

(Planar Layout of Memory Cell Array 103)

FIG. 18 is a plan view illustrating an example of a planar layout of the memory cell array 103 included in the memory device 100 according to the fourth embodiment. FIG. 18 illustrates an area that includes one block BLK in the memory region MR. As illustrated in FIG. 18, the memory device 100 includes, for example, a plurality of slits SLT, a plurality of slits SHE, a plurality of memory pillars MP, a plurality of bit lines BL, and a plurality of contacts CV. In the memory region MR, a planar layout described below is repeatedly arranged in the Y direction.

Each slit SLT has, for example, a structure in which an insulating member is embedded. Each slit SLT insulates adjacent interconnects (for example, the word lines WL0 to WL7 and the select gate lines SGD and SGS) via the slit SLT. Each slit SLT has a portion that is provided to extend along the X direction and that crosses the memory region MR and the hookup regions HR1 and HR2, along the X direction. The slits SLT are arranged in the Y direction. The regions that are delimited by the slits SLT correspond to the blocks BLK.

Each slit SHE has, for example, a structure in which an insulating member is embedded. The slits SHE insulate adjacent interconnects (at least select gate line SGD) from each other via the slits SLT. Each slit SHE has a portion that is provided so as to extend along the X direction and that crosses the memory region MR. The slits SHE are arranged in the Y direction. In this example, three slits SHE are arranged between adjacent slits SLT. A plurality of regions partitioned by the slits SLT and SHE correspond to the string units SU0 to SU3, respectively.

Each memory pillar MP functions as, for example, one NAND string NS. The memory pillars MP are arranged in, for example, 19 rows in a staggered manner in a region between two adjacent slits SLT. Further, the respective slits SHE overlap the fifth row of the memory pillars MP, the tenth row of the memory pillars M, and the fifteenth row of the memory pillars MP, from the upper side of the drawing.

Each of the bit lines BL has a portion that is provided to extend along the Y direction, and that crosses a region where the blocks BLK are provided, along the Y direction. The bit lines BL are arranged in the X direction. Each bit line BL is arranged to overlap at least one memory pillar MP for each string unit SU. In this example, two bit lines BL overlap each memory pillar MP.

Each contact CV is provided between one bit line BL among the bit lines BL overlapping the memory pillar MP, and the memory pillar MP. The contact CV electrically connects the memory pillar MP and the bit line BL. Note that illustration of the contact CV between the memory pillar MP overlapping the slit SHE and the bit line BL is omitted.

(Cross-Sectional Structure of Memory Cell Array 103)

FIG. 19 is a cross-sectional view illustrating an example of a cross-sectional structure of the memory cell array 103 included in the memory device 100 according to the fourth embodiment. FIG. 19 illustrates a cross-section taken along the Y direction and including the memory pillars MP and the slit SLT in the memory region MR. As illustrated in FIG. 19, the memory device 100 includes, for example, insulating layers 110 to 118, conductive layers 120 to 126, and contacts V1 and V2.

The insulating layer 110 is provided, for example, in the lowermost layer of the memory chip MC. The layer in which the insulating layer 110 is formed may be provided with an interconnect used for connection of the conductive layer 120 and/or the pad PD. The conductive layer 120 is provided on the insulating layer 110. The insulating layer 111 is provided on the conductive layer 120. The conductive layers 121 and the insulating layers 112 are alternately provided on the insulating layer 111. The insulating layer 113 is provided on the uppermost conductive layer 121. The conductive layers 122 and the insulating layers 114 are alternately provided on the insulating layer 113. The insulating layer 115 is provided on the uppermost conductive layer 122. The conductive layers 123 and the insulating layers 116 are alternately provided on the insulating layer 115. The insulating layer 117 is provided on the uppermost conductive layer 123. The conductive layer 124 is provided on the insulating layer 117. The insulating layer 118 is provided on the conductive layer 124. The layer in which the insulating layer 118 is formed includes the contacts V1 and V2 and the conductive layers 125 and 126. The contact V1 is provided on the conductive layer 124. The conductive layer 125 is provided on the contact V1. The contact V2 is provided on the conductive layer 125. The conductive layer 126 is provided on the contact V2.

Each of the conductive layers 120, 121, 122, and 123 has, for example, a portion formed in a plate shape that extends along the XY plane. The conductive layer 124 has, for example, a portion formed in a line shape that extends in the Y direction. The conductive layers 120, 121, and 123 are used as a source line SL, a select gate line SGS, and a select gate line SGD, respectively. The conductive layers 123 are used as the word lines WL0 to WL7, respectively, in order from the lower side. The conductive layer 124 is used as the bit line BL. The conductive layers 124 and 125 are interconnected via the contact V1. The conductive layer 125 and the conductive layer 126 are interconnected via the contact V2. The conductive layer 126 is in contact with the interface (bonded surface) of the memory chip MC and is used as a bonding pad BP. The conductive layer 126 includes copper, for example.

The slit SLT has a portion formed in a plate shape that extends along the XZ plane, and divides the insulating layers 111 to 116 and the conductive layers 121 to 123. Each memory pillar MP is provided to extend along the Z direction, and extends through the insulating layers 111 to 116 and the conductive layers 121 to 123. Each memory pillar MP includes, for example, a core member 130, a semiconductor layer 131, and a stacked film 132. The core member 130 is an insulator provided to extend along the Z direction. The semiconductor layer 131 covers the core member 130. A lower portion of the semiconductor layer 131 is in contact with the conductive layer 120. The stacked film 132 covers the lateral surface of the semiconductor layer 131. The contact CV is provided on the semiconductor layer 131. The semiconductor layer 131 is electrically connected to the conductive layer 124 via the contact CV.

Note that, the illustrated region illustrates the contact CV corresponding to one memory pillar MP of the two memory pillars MP. A contact CV is connected, in a region (not illustrated), to the memory pillar MP to which the contact CV is not connected in the region. A portion where the memory pillar MP intersects the conductive layers 61 functions as the select transistor STS. The portion where the memory pillar MP intersects the conductive layer 122 functions as the memory cell transistor MT. The portion where the memory pillar MP intersects the conductive layers 123 functions as the select transistor STD. In the following explanation, the interconnect layer portions including the conductive layers 124, 125, and 126 are referred to as "M0", "M1", and "M2", respectively.

(Cross-Sectional Structure of Memory Pillar MP)

Figure 20:
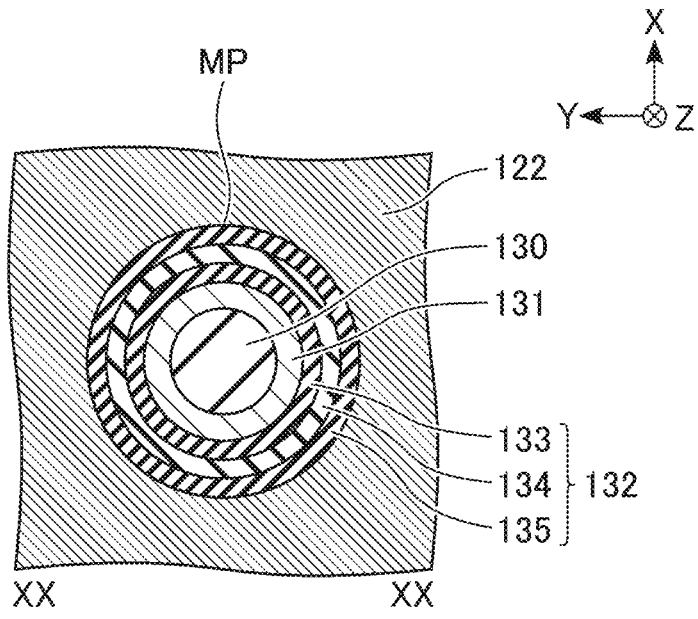
FIG. 20 is a cross-sectional view taken along line XX-XX of FIG. 19 and illustrating an example of a cross-sectional structure of memory pillars included in the memory device according to the fourth embodiment.

FIG. 20 is a cross-sectional view taken along line XX-XX of FIG. 19 and illustrating an example of a cross-sectional structure of memory pillars MP included in the memory device 10 according to the fourth embodiment. FIG. 20 illustrates a cross-section that includes the memory pillar MP and the conductive layer 122 and that extends parallel to the X direction and the Y direction. As illustrated in FIG. 20, the stacked film 132 includes, for example, a tunnel insulating film 133, an insulating film 134, and a block insulating film 135.

The core member 130 is provided, for example, at the center portion of the memory pillar MP. The semiconductor layer 131 surrounds the lateral surface of the core member 130. The tunnel insulating film 133 surrounds the lateral surface of the semiconductor layer 131. The insulating film 134 surrounds the lateral surface of the tunnel insulating film 133. The block insulating film 135 surrounds the lateral surface of the insulating film 134. The conductive layer 122 surrounds the lateral surface of the block insulating film 135. The semiconductor layer 131 is used as a channel (current path) of the memory cell transistors MT0 to MT7 and the select transistors STD and STS. Each of the tunnel insulating film 133 and the block insulating film 135 contains, for example, silicon oxide ($SiO_2$). The insulating film 134 is used as the charge storage layer of the memory cell transistor MT, and includes, for example, silicon nitride (SiN). As a result, each of the memory pillars MP functions as one NAND string NS.

<4-3-2> Cross-Sectional Structure of Memory Device 100

FIG. 21 is a cross-sectional view illustrating an example of a cross-sectional structure of the memory device 100 according to the fourth embodiment. FIG. 21 illustrates a cross-section that includes the memory region MR and the sense amplifier region SR, that is, a cross-section including the memory chip MC and the CMOS chip CC. As illustrated in FIG. 21, the memory device 100 includes a semiconductor substrate 140, conductive layers GC and 141 to 144, and contacts CS and C0 to C3 in the sense amplifier region SR.

The semiconductor substrate 140 is a substrate that is used to form the CMOS chip CC. The semiconductor substrate 140 includes a plurality of well regions (not illustrated). For example, a transistor TR is formed in each of the plurality of well regions. The plurality of well regions are separated by shallow trench isolations (STI), for example. A conductive layer GC is provided on the semiconductor substrate 140 via a gate insulating film. The conductive layer GC in the sense amplifier region SR is used as a gate electrode of the transistor TR included in the sense amplifier module 106. The contact C0 is provided on the conductive layer GC. Two contacts CS are provided on the semiconductor substrate 140 in correspondence with the source and the drain of the transistor TR.

The conductive layer 141 is provided on each of the contacts CS and the contact C0. The contact C1 is provided on the conductive layer 141. The conductive layer 142 is provided on the contact C1. The conductive layers 141 and 142 are electrically connected via the contact C1. The contact C2 is provided on the conductive layer 142. The conductive layer 143 is provided on the contact C2. The conductive layers 142 and 143 are electrically connected via the contact C2. The contact C3 is provided on the conductive layer 143. The conductive layer 144 is provided on the contact C3. The conductive layers 143 and 144 are electrically connected via the contact C3. Hereinafter, the interconnect layers in which the conductive layers 141 to 144 are provided are referred to as "D0", "D1", "D2", and "D3", respectively.

The conductive layer 144 is in contact with the interface (bonded surface) of the CMOS chip CC and is used as a bonding pad BP. The conductive layer 144 in the sense amplifier region SR is bonded to the conductive layer 126 (that is, the bonding pad BP of the memory chip MC) in the memory region MR that is arranged to face the conductive layer 144. Further, each conductive layer 144 in the sense amplifier region SR is electrically connected to one bit line BL. The conductive layer 144 includes copper, for example. In the memory device 100, the interconnect layer D3 of the CMOS chip CC and the interconnect layer M2 of the memory chip MC are adjacent to each other due to the memory chip MC and the CMOS chip CC being bonded to each other.

In the present example, the semiconductor substrate used to form the memory chip MC is removed along with processes, such as pad formation after the bonding process. Note that the semiconductor substrate used to form the memory chip MC may be left. In addition, the number of interconnect layers of each of the memory chip MC and the CMOS chip CC may properly be changed according to the configuration of the memory device 100.

<4-4> Advantageous Effects of Fourth Embodiment

The exposure method described in the first embodiment and the method for manufacturing a semiconductor device described in the second and third embodiments can be applied to the manufacturing of the memory device 100 according to the fourth embodiment described above. Hereinafter, a case where the method for manufacturing a semiconductor device according to the third embodiment is applied to the memory device 100 according to the fourth embodiment will be described.

For example, in the interconnect layer M0, the bit line BL having a portion provided extending in the Y direction is a main pattern, the degree of difficulty in overlay in the X direction is high, and there is a margin in the management specification of the overlay in the Y direction. In the interconnect layer M1, the conductive layer 125 having a portion extending in the X direction is provided, the degree of difficulty in overlay in the Y direction is high, and there is a margin in the management specification of the overlay in the X direction. Since a relatively rough pattern is handled in the interconnect layer M0, there is a margin in management specifications of the overlay in both the X direction and the Y direction.

In this case, in the alignment of the exposure process associated with the interconnect layer M0, it is preferable that the upper and lower limit correction mode is applied in the Y direction and the normal mode is applied in the X direction. Similarly, in the alignment of the exposure process associated with the interconnect layer M1, it is preferable that the upper and lower limit correction mode is applied in the X direction and the normal mode is applied in the Y direction. In the alignment of the exposure process associated with the interconnect layer M2, it is preferable that the upper and lower limit correction mode is applied to both the X direction and the Y direction.

As described above, the alignment of the upper and lower limit correction mode with respect to one or both of the X direction and the Y direction is applied according to the pattern provided in each layer. In other interconnect layers, the alignment of the upper and lower limit correction mode can be appropriately applied based on the management specifications of the overlay in the X direction and the Y direction. As a result, the yield of the memory device 100 according to the fourth embodiment can be improved by applying the method for manufacturing a semiconductor device according to the third embodiment.

Note that an object to which the exposure method described in the first embodiment and the method for manufacturing a semiconductor device described in the second and third embodiments are applied is not limited to only the memory device 100. An object to which the exposure method described in the first embodiment and the method for manufacturing a semiconductor device described in the second and third embodiments are applied may be a semiconductor device having a bonding structure.

<5> Modification

In the above embodiments, the flowcharts used for describing the exposure method and the method for manufacturing a semiconductor device are merely examples. In the operations described using the flowcharts, the order of processes are interchangeable within a permissible range, other processes may be added, or some of the processes may be omitted. FIG. 9 described in the second embodiment illustrates a case where the exposure process to which the upper and lower limit correction mode is applied is executed in three layers, but the present invention is not limited thereto. In the second embodiment, the exposure process to which the upper and lower limit correction mode is applied may be executed in two or more layers. Similarly, FIG. 13 described in the third embodiment illustrates a case where the exposure process to which the upper and lower limit correction mode is applied in the X direction and/or the Y direction is executed in three layers, but the present invention is not limited thereto. In the third embodiment, the exposure process to which the upper and lower limit correction mode is applied in the X direction and/or the Y direction may be executed in two or more layers.

In the above embodiments, the case where the alignment correction in which both the upper limit value U_Limit and the lower limit value L_Limit of the wafer magnification component are set is executed in the upper and lower limit correction mode has been described, but the present invention is not limited thereto. In the upper and lower limit correction mode, only the upper limit value U_Limit of the wafer magnification component may be set, or only the lower limit value L_Limit of the wafer magnification component may be set. For example, in a case where only the lower limit value L_Limit is set in the upper and lower limit correction mode, in the process of S106 of FIG. 5, in a case where the value of the base wafer magnification component W_Mag_B is equal to or larger than L_Limit, the process of S108 is executed. For example, in a case where only the upper limit value U_Limit is set in the upper and lower limit correction mode, in the process of S106 of FIG. 5, when the value of the base wafer magnification component W_Mag_B is equal to or less than U_Limit, the process of S108 is executed. The alignment correction in which only the upper limit value U_Limit or the lower limit value L_Limit of the wafer magnification component is set in this manner may be applied independently in the X direction and the Y direction as in the third embodiment.

As the control device 11, a micro processing unit (MPU), an application specific integrated circuit (ASIC), a field-programmable gate array (FPGA), or the like, may also be used instead of the CPU. Furthermore, each of the processes described in the above embodiments may be realized using dedicated hardware. The processes described in the above embodiments may be a mixture of processes executed by software and processes executed by hardware, or only either one of such processes may be used.

The circuit configuration, planar layout, and cross-sectional structure of the memory device 100 described in the fourth embodiment can be appropriately changed according to the design of the memory device 100. For example, although a case where the memory chip MC is provided on the CMOS chip CC has been given by way of an example in the fourth embodiment, the CMOS chip CC may also be provided on the memory chip MC. In the fourth embodiment, the case where the memory chip MC is allocated to the lower wafer LW and the CMOS chip CC is allocated to the upper wafer UW has been given by way of an example, but the memory chip MC may be allocated to the upper wafer UW, and the CMOS chip CC may be allocated to the lower wafer LW.

In the present specification, the term "connection" indicates that two elements are electrically connected, and does not preclude another element being interposed therebetween. The term "electrically connected" may signify that an insulator is interposed, as long as operation like that afforded by an electrical connection is possible. The term "region" may be regarded as indicating a configuration that is included in the semiconductor substrate. For example, in a case where it is prescribed that the semiconductor substrate 140 includes the memory region MR, the memory region MR is associated with an upper region of the semiconductor substrate 140. The bonding pads BP may also be referred to as "joint metal". The camera 35 of the exposure apparatus 1 may have a configuration in which an optical system (microscope) and a light receiving sensor are separated. The measurement mechanism corresponding to the camera 35 may be externally connected to the exposure apparatus 1. In the present specification, "overlay deviation" may also be paraphrased as "misalignment". The "visually recognize" includes observing an object from a desired direction via a microscope, a camera, or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposure apparatus comprising:
   a stage configured to hold a substrate; and
   a control device configured to execute an exposure process on the substrate; wherein
   in the exposure process, the control device is further configured to:
   calculate a calculated value of a magnification component by performing function approximation on measurement results of three or more alignment marks arranged on the substrate in an orthogonal coordinate system;
   set a first lower limit value and/or a first upper limit value for an alignment correction value of a magnification component;
   in a case where the calculated value is larger than or equal to the first lower limit value and/or less than or equal to the first upper limit value, set the alignment correction value of the magnification component to a first correction value;
   in a case where the first lower limit value is set and the calculated value is less than the first lower limit value, set the alignment correction value of the magnification component to a second correction value that is larger than the calculated value and smaller than the first correction value; and
   in a case where the first upper limit value is set and the calculated value exceeds the first upper limit value, set the alignment correction value of the magnification component to a third correction value that is larger than the first correction value and smaller than the calculated value.

2. The exposure apparatus of claim 1, wherein
   the second correction value is a value obtained by adding the calculated value to the first correction value and further subtracting the first lower limit value, and
   the third correction value is a value obtained by adding the calculated value to the first correction value and further subtracting the first upper limit value.

3. The exposure apparatus of claim 1, wherein
the first lower limit value is a value obtained by adding the
first correction value to a lower limit management
value of an overlay deviation of the magnification
component in a target step of the exposure process, and
the first upper limit value is a value obtained by adding the
first correction value to an upper limit management
value of the overlay deviation of the magnification
component in the target step of the exposure process.
4. The exposure apparatus of claim 1, wherein
the orthogonal coordinate system includes a first direction
and a second direction orthogonal to the first direction,
each of the first correction value, the second correction
value, and the third correction value is an alignment
correction value of a magnification component in the
first direction,
in the exposure process, the control device is further
configured to:
set a second lower limit value and/or a second upper limit
value for an alignment correction value of a magnifi-
cation component;
in a case where the calculated value is larger than or equal
to the second lower limit value and/or less than or equal
to the second upper limit value, set an alignment
correction value of a magnification component in the
second direction to a fourth correction value;
in a case where the second lower limit value is set and the
calculated value is less than the second lower limit
value, set the alignment correction value of the mag-
nification component in the second direction to a fifth
correction value that is larger than the calculated value
and smaller than the fourth correction value; and
in a case where the second upper limit value is set and the
calculated value exceeds the second upper limit value,
set the alignment correction value of the magnification
component in the second direction to a sixth correction
value that is larger than the fourth correction value and
smaller than the calculated value,
the second lower limit value is different from the first
lower limit value, and
the second upper limit value is different from the first
upper limit value.
5. The exposure apparatus of claim 1, wherein
the orthogonal coordinate system includes a first direction
and a second direction orthogonal to the first direction,
each of the first correction value, the second correction
value, and the third correction value is an alignment
correction value of a magnification component in the
first direction, and
in the exposure process, the control device is further
configured to set an alignment correction value of a
magnification component in the second direction to
substantially the same value as the calculated value.
6. An exposure method comprising:
calculating a calculated value of a magnification compo-
nent by performing function approximation on mea-
surement results of three or more alignment marks
arranged on a substrate in an orthogonal coordinate
system;
setting a first lower limit value and/or a first upper limit
value for an alignment correction value of a magnifi-
cation component;
in a case where the calculated value is larger than or equal
to the first lower limit value and/or less than or equal to
the first upper limit value, setting the alignment cor-
rection value of the magnification component to a first
correction value;

in a case where the first lower limit value is set and the
calculated value is less than the first lower limit value,
setting the alignment correction value of the magnifi-
cation component to a second correction value that is
larger than the calculated value and smaller than the
first correction value, and
in a case where the first upper limit value is set and the
calculated value exceeds the first upper limit value,
setting the alignment correction value of the magnifi-
cation component to a third correction value that is
larger than the first correction value and smaller than
the calculated value.
7. The exposure method of claim 6, wherein
the second correction value is a value obtained by adding
the calculated value to the first correction value and
further subtracting the first lower limit value, and
the third correction value is a value obtained by adding the
calculated value to the first correction value and further
subtracting the first upper limit value.
8. The exposure method of claim 6, wherein
the first lower limit value is a value obtained by adding the
first correction value to a lower limit management
value of an overlay deviation of the magnification
component in a target step of an exposure process, and
the first upper limit value is a value obtained by adding the
first correction value to an upper limit management
value of the overlay deviation of the magnification
component in the target step of the exposure process.
9. The exposure method of claim 6, wherein
the orthogonal coordinate system includes a first direction
and a second direction orthogonal to the first direction,
each of the first correction value, the second correction
value, and the third correction value is an alignment
correction value of a magnification component in the
first direction, the method further comprising:
setting a second lower limit value and/or a second upper
limit value for an alignment correction value of a
magnification component;
in a case where the calculated value is larger than or equal
to the second lower limit value and/or less than or equal
to the second upper limit value, setting an alignment
correction value of a magnification component in the
second direction to a fourth correction value;
in a case where the second lower limit value is set and the
calculated value is less than the second lower limit
value, setting the alignment correction value of the
magnification component in the second direction to a
fifth correction value that is larger than the calculated
value and smaller than the fourth correction value;
in a case where the second upper limit value is set and the
calculated value exceeds the second upper limit value,
setting the alignment correction value of the magnifi-
cation component in the second direction to a sixth
correction value that is larger than the fourth correction
value and smaller than the calculated value;
the second lower limit value is different from the first
lower limit value, and
the second upper limit value is different from the first
upper limit value.
10. The exposure method of claim 6, wherein
the orthogonal coordinate system includes a first direction
and a second direction orthogonal to the first direction,
each of the first correction value, the second correction
value, and the third correction value is an alignment
correction value of a magnification component in the
first direction, the method further comprising, setting an alignment correction value of a magnification component in the second direction to substantially the same value as the calculated value.

11. A method for manufacturing a semiconductor device, comprising:

in a first exposure step, calculating a first calculated value of a magnification component by performing function approximation on measurement results of three or more alignment marks arranged on a substrate in an orthogonal coordinate system;

setting a first lower limit value and/or a first upper limit value for an alignment correction value of a magnification component;

in a case where the first calculated value is larger than or equal to the first lower limit value and/or less than or equal to the first upper limit value, setting the alignment correction value of the magnification component to a first correction value;

in a case where the first lower limit value is set and the first calculated value is less than the first lower limit value, setting the alignment correction value of the magnification component to a second correction value that is larger than the first calculated value and smaller than the first correction value, and in a case where the first upper limit value is set and the first calculated value exceeds the first upper limit value, setting the alignment correction value of the magnification component to a third correction value that is larger than the first correction value and smaller than the first calculated value.

12. The method for manufacturing a semiconductor device of claim 11, wherein the second correction value is a value obtained by adding the first calculated value to the first correction value and further subtracting the first lower limit value, and the third correction value is a value obtained by adding the first calculated value to the first correction value and further subtracting the first upper limit value.

13. The method for manufacturing a semiconductor device of claim 11, wherein the first lower limit value is a value obtained by adding the first correction value to a lower limit management value of an overlay deviation of the magnification component in the first exposure step, and the first upper limit value is a value obtained by adding the first correction value to an upper limit management value of the overlay deviation of the magnification component in the first exposure step.

14. The method for manufacturing a semiconductor device of claim 11, wherein the orthogonal coordinate system includes a first direction and a second direction orthogonal to the first direction, each of the first correction value, the second correction value, and the third correction value is an alignment correction value of a magnification component in the first direction, in the first exposure step, the method further comprising:

further setting a second lower limit value and/or a second upper limit value for an alignment correction value of a magnification component;

in a case where the first calculated value is larger than or equal to the second lower limit value and/or less than or equal to the second upper limit value, setting an alignment correction value of a magnification component in the second direction to a fourth correction value;

in a case where the second lower limit value is set and the first calculated value is less than the second lower limit value, setting the alignment correction value of the magnification component in the second direction to a fifth correction value that is larger than the first calculated value and smaller than the fourth correction value;

in a case where the second upper limit value is set and the first calculated value exceeds the second upper limit value, setting the alignment correction value of the magnification component in the second direction to a sixth correction value that is larger than the fourth correction value and smaller than the first calculated value;

the second lower limit value is different from the first lower limit value, and the second upper limit value is different from the first upper limit value.

15. The method for manufacturing a semiconductor device of claim 11, wherein the orthogonal coordinate system includes a first direction and a second direction orthogonal to the first direction, each of the first correction value, the second correction value, and the third correction value is an alignment correction value of a magnification component in the first direction, the method further comprising, in the first exposure step, setting an alignment correction value of a magnification component in the second direction to substantially the same value as the first calculated value.

16. The method for manufacturing a semiconductor device of claim 11, further comprising:

in a second exposure step after the first exposure step for the substrate, calculating a second calculated value of a magnification component by performing function approximation on measurement results of three or more alignment marks arranged on the substrate in an orthogonal coordinate system;

setting a third lower limit value and/or a third upper limit value for an alignment correction value of a magnification component;

in a case where the second calculated value is larger than or equal to the third lower limit value and/or less than or equal to the third upper limit value, setting the alignment correction value of the magnification component to a seventh correction value;

in a case where the third lower limit value is set and the second calculated value is less than the third lower limit value, setting the alignment correction value of the magnification component to an eighth correction value that is larger than the second calculated value and smaller than the seventh correction value; and in a case where the third upper limit value is set and the second calculated value exceeds the third upper limit value, setting the alignment correction value of the magnification component to a ninth correction value that is larger than the seventh correction value and smaller than the second calculated value.

17. The method for manufacturing a semiconductor device of claim 16, wherein the orthogonal coordinate system includes a first direction and a second direction orthogonal to the first direction, each of the first correction value, the second correction value, and the third correction value is an alignment correction value of a magnification component in the first direction, and each of the seventh correction value, the eighth correction value, and the ninth correction value is an alignment correction value of a magnification component in the second direction.

* * * * *